(12) United States Patent
Park et al.

(10) Patent No.: US 10,461,196 B2
(45) Date of Patent: Oct. 29, 2019

(54) CONTROL OF LENGTH IN GATE REGION DURING PROCESSING OF VFET STRUCTURES

(71) Applicant: GLOBALFOUNDRIES Inc., Grand Cayman (KY)

(72) Inventors: Chanro Park, Clifton Park, NY (US); Steven Bentley, Menands, NY (US); Ruilong Xie, Niskayuna, NY (US); Min Gyu Sung, Latham, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/662,526

(22) Filed: Jul. 28, 2017

(65) Prior Publication Data

US 2019/0035938 A1 Jan. 31, 2019

(51) Int. Cl.
| | |
|---|---|
| H01L 29/786 | (2006.01) |
| H01L 21/84 | (2006.01) |
| H01L 27/12 | (2006.01) |
| H01L 29/423 | (2006.01) |
| H01L 29/66 | (2006.01) |
| H01L 29/78 | (2006.01) |

(52) U.S. Cl.
CPC ........ *H01L 29/78642* (2013.01); *H01L 21/84* (2013.01); *H01L 27/1203* (2013.01); *H01L 29/42384* (2013.01); *H01L 29/6675* (2013.01); *H01L 29/66545* (2013.01); *H01L 29/66666* (2013.01); *H01L 29/7827* (2013.01); *H01L 29/78648* (2013.01)

(58) Field of Classification Search
CPC .......................... H01L 29/78642; H01L 21/84

USPC ......................................................... 438/268
See application file for complete search history.

(56) References Cited

U.S. PATENT DOCUMENTS

| | | |
|---|---|---|
| 6,406,962 B1 | 6/2002 | Agnello et al. |
| 6,664,143 B2 | 12/2003 | Zhang |
| | (Continued) | |

FOREIGN PATENT DOCUMENTS

TW      201719903 A    6/2017

OTHER PUBLICATIONS

TW Office Action and English Translation thereof for Taiwanese Patent Application No. 10820032270 dated Jan. 11, 2019, 13 pages.

*Primary Examiner* — Igwe U Anya

(74) *Attorney, Agent, or Firm* — Anthony Canale; Hoffman Warnick LLC

(57) ABSTRACT

Forming a vertical FinFET includes forming a semiconductor fin on a substrate and having a fin mask on an upper surface thereof; laterally recessing the semiconductor fin causing the fin mask; forming a conformal gate liner on the recessed semiconductor fin and the fin mask, wherein the conformal gate liner includes a first portion surrounding the fin mask and a second portion surrounding the recessed fins and being separated from the fin mask by a thickness of the conformal gate liner; forming a gate mask laterally adjacent to the second portion of the conformal gate liner; removing the first portion of the conformal gate liner; removing the gate mask to expose a remaining second portion of the conformal gate liner; and forming a gate contact to the second portion of the conformal gate liner, the remaining second portion of the conformal gate liner defines the gate length.

16 Claims, 19 Drawing Sheets

(56) References Cited

U.S. PATENT DOCUMENTS

| | | | |
|---|---|---|---|
| 6,890,812 | B2 | 5/2005 | Forbes et al. |
| 9,793,395 | B1 * | 10/2017 | Liu .................... H01L 29/7827 |
| 9,812,567 | B1 * | 11/2017 | Basker ............... H01L 29/7827 |
| 9,825,032 | B1 * | 11/2017 | Bentley ............. H01L 29/41791 |
| 2004/0007721 | A1 | 1/2004 | Forbes et al. |
| 2005/0186742 | A1 | 8/2005 | Oh et al. |
| 2017/0069725 | A1 | 3/2017 | Bhimarasetti et al. |
| 2017/0373166 | A1 * | 12/2017 | Bergendahl ........... H01L 29/785 |

\* cited by examiner

CONTROL OF LENGTH IN GATE REGION DURING PROCESSING OF VFET STRUCTURES

BACKGROUND

Technical Field

The present disclosure relates to the processing of vertical field effect transistor (vertical FinFET) devices of an integrated circuit (IC) structure, and more particularly, methods of controlling the length of a gate region of a vertical FinFET during formation of the structure.

Related Art

Advanced manufacturing of ICs requires formation of individual circuit elements, e.g., transistors such as field-effect-transistors (FETs), and the like based on specific circuit designs. A FET generally includes source, drain, and gate terminals. The gate terminal is placed between the source and drain terminals and controls the current between the source and drain terminals. Transistors may be formed over a substrate and may be electrically isolated with an insulating dielectric layer, e.g., inter-level dielectric (ILD) layer. Contacts may be formed to each of the source, drain, and gate terminals through the dielectric layer in order to provide electrical connection between the transistors and other circuit elements that may be formed subsequent to the transistor in other metal levels.

Conventionally, FETs are horizontal transistors wherein the source and drain terminals are adjacent to one other on or within the substrate, and the gate terminal is disposed laterally between the source and drain terminals over the substrate. However, vertical transistors have recently become of interest in the field. Vertical FinFETs differ from conventional FETs in that one of the source and/or drain terminals is located above the other source and/or drain terminal(s) with the gate terminal positioned vertically therebetween. The physical differences between vertical FinFETs and other transistors can be associated with corresponding differences in processing and device performance. One of the technical challenges associated with forming a vertical FinFET structure is controlling the size of a gate structure for the vertical FinFET, i.e., keeping the gate structure within a predetermined vertical length. To control the length of a gate in a vertical FinFET, circuit fabricators may rely upon interferometers to generate a signal for sizing and forming the gate and other device structures. In the case of a vertical FinFET, interferometer signals may be less effective in structures with relatively large shallow trench isolations (STIs), e.g., due to possible interference between the interferometer signal and the STI sidewalls. In some cases, e.g., devices with increasingly high pattern densities, conventional processing may not fully account for physical limitations on masking materials to mitigate interference.

SUMMARY

A first aspect of the disclosure provides a method of forming a vertical FinFET, the method including: forming a semiconductor fin on a substrate and having a fin mask on an upper surface thereof; laterally recessing the semiconductor fin causing the fin mask to overhang above the fin; forming a conformal gate liner on the recessed semiconductor fin and the fin mask, wherein the conformal gate liner includes a first portion surrounding the fin mask and a second portion surrounding the recessed fins and being separated from the fin mask by a thickness of the conformal gate liner; forming a gate mask laterally adjacent to the second portion of the conformal gate liner; removing the first portion of the conformal gate liner, wherein the second portion of the conformal gate liner remains intact after the removing of the first portion; removing the gate mask to expose the remaining second portion of the conformal gate liner; and forming a gate contact to the remaining second portion of the conformal gate liner, wherein a length of the gate is defined by the remaining second portion of the conformal gate liner.

A second aspect of the disclosure provides a method of forming a vertical FinFET, the method including: forming a semiconductor fin on a substrate having a fin mask on an upper surface thereof; laterally recessing the semiconductor fin causing the fin mask to overhang above the fin; forming a conformal gate liner on the recessed semiconductor fin and the fin mask, wherein the conformal gate liner includes a first portion surrounding the fin mask and a second portion surrounding the recessed fins and being separated from the fin mask by a thickness of the conformal gate liner; forming an inner spacer on the conformal gate liner; forming an intermediate mask on a portion of the inner spacer that is above the fin mask to vertically cover a vertical portion of the conformal gate liner and the inner spacer adjacent to the recessed semiconductor fin; directionally etching to remove portions of the conformal gate liner and the inner spacer directly above the substrate and not vertically covered by the intermediate mask; removing the intermediate mask; forming a gate mask laterally adjacent to the second portion of the conformal gate liner; removing the first portion of the conformal gate liner and portions of the inner spacer not covered by the gate mask, wherein the second portion of the conformal gate liner and a portion of the inner spacer remain intact after the removing of the first portion; removing the gate mask to expose the remaining second portion of the conformal gate liner and the remaining portion of the inner spacer; and forming a gate contact to the remaining second portion of the conformal gate liner, wherein a length of the gate is defined by the remaining second portion of the conformal gate liner.

A third aspect of the disclosure provides a method of forming an integrated circuit (IC) structure, the method including: forming a semiconductor fin on a substrate and having a fin mask on an upper surface thereof; laterally recessing the semiconductor fin causing the fin mask to overhang above the fin; forming a sacrificial dielectric layer laterally adjacent to the semiconductor fin and the fin mask; removing the fin mask to form a cavity within the sacrificial dielectric layer, wherein removing the fin mask exposes an upper surface of the semiconductor fin; forming a source/drain region on the exposed upper surface of the semiconductor fin, the source/drain region being within the cavity; removing the sacrificial dielectric layer; and forming a conformal gate liner on the recessed semiconductor fin, the conformal gate liner being separated from the source/drain region by a thickness of the conformal gate liner; and forming a gate contact to the conformal gate liner, wherein a length of the gate is defined by the conformal gate liner on the recessed semiconductor fin.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The various embodiments described herein may be implemented in the context of forming a vertical transistor, also known as a vertical field effect transistor or "vertical FinFET." Vertical transistors may be distinguished from other transistor configurations, e.g., MOSFET, FINFET, tunnel FET, and/or other types of transistors by including a set of vertically stacked terminals. For instance, a vertical transistor may include a source terminal positioned vertically beneath a gate terminal to the transistor, with an insulator vertically separating the gate from the source. Similarly, a drain terminal of the transistor can be positioned above and vertically separated from the gate terminal, e.g., with another insulating material. Contacts to the source, drain, and/or gate terminals of a vertical transistor can be positioned laterally adjacent to the device in a shared dielectric layer in a spaced arrangement. Such vertical transistor structures are a contrast to other devices, e.g., where contacts to the various terminals only extend vertically to the transistor through overlying layers.

Figure 37:
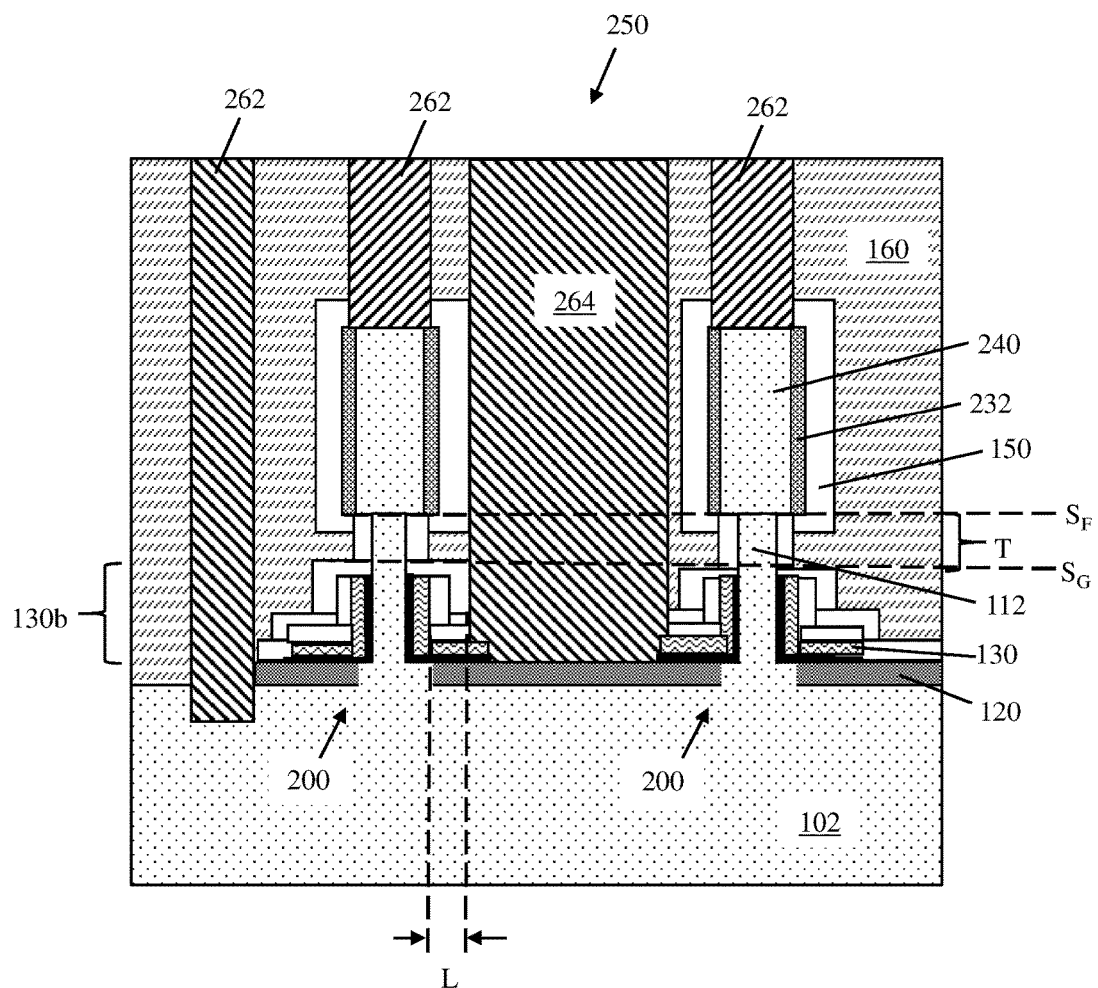
FIG. 37 provides a cross-sectional view of a vertical FinFET according to embodiments of the disclosure.

The present disclosure relates to the processing of vertical FinFETs in an integrated circuit (IC) device, and more particularly, to control the gate length by using a conformal gate liner to define the vertical separation between source/drain and gate regions of the vertical FinFET. Specifically, the present disclosure provides various techniques for masking portions of a conformal gate liner and removing portions of the conformal gate liner not covered by the mask to, such that a thickness of the conformal gate liner separates the remainder of the gate conformal gate liner from an overlying portion of a source/drain region for the vertical FinFET. Using the thickness of the deposited conformal gate liner to control the vertical separation between the gate and source/drain regions of the vertical FinFET, can reduce the vertical length of the gate as compared to conventional vertical FinFET processing. Among other things, using the conformal gate liner to control gate length can promote reliable device performance after remaining portions of the device have been formed. FIGS. 1-36 show a cross-sectional view of a structure being processed according to embodiments of the disclosure. Any varied or alternative implementations according to the disclosure may be implemented after initial processing of the same or similar precursor structures as noted herein. FIG. 37 illustrates a vertical FinFET which may be formed by the processing techniques described herein.

Figure 1:
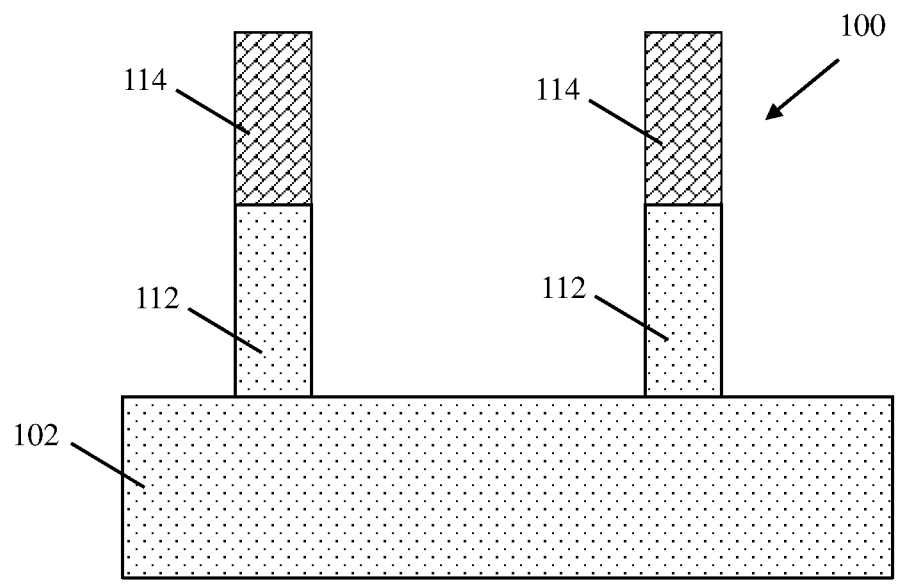
FIG. 1 provides a cross-sectional view of a substrate and pair of semiconductor fins to be processed according to the disclosure.

Referring initially to FIG. 1, a precursor structure 100 is shown. Precursor structure 100 may include a substrate 102. As shown, substrate 102 may include any currently-known or later developed material capable of being processed into a transistor structure, and may include, e.g., a bulk semiconductor layer, a semiconductor-on-insulator (SOI) substrate, etc. Substrate 102 thus may overlie one or more other layers of material having distinct material and/or electrical properties, with such layers of material being omitted from the accompanying FIGS. to better illustrate structures and processes to form an IC structure according to the disclosure. Substrate 102 may include any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 102 or a portion thereof may be strained.

Substrate 102 of precursor structure 100 may be formed by forming a semiconductor material on an underlying structure. According to an example, substrate 102 can be formed by deposition and/or wafer bonding, e.g., separation by implantation of oxygen (SIMOX). As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Still referring to FIG. 1, one or more semiconductor fins (simply "fins" hereafter) 112 may be formed from substrate 102. Each fin 112 may be formed by forming a fin mask 114 over various portions of a semiconductor layer, and patterning and etching fin mask 114 such that a portion of fin mask 114 remains intact where fin(s) 112 are desired. Subsequently, the original semiconductor material may be etched such that the portion of substrate 102 that is covered or protected by fin mask 114 forms fin 112. Fin mask 114 may include silicon dioxide and/or silicon nitride, or any other hard mask material known in the art. Fin mask 114 can be subdivided into multiple layers of material. According to an example, fin mask 114 can include multiple layers of distinct masking materials, e.g., a deposited layer of silicon dioxide, with a layer of silicon nitride thereon, and a capping layer of silicon dioxide positioned on the silicon nitride layer. While two fins 112, are shown, it is understood that any number of fins 112 (e.g., one fin, five fins, one hundred fins, one thousand or more fins, etc.) may be formed on substrate 102 without departing from aspects of the disclosure. The embodiments described herein are thus operable for processing one fin 112 and/or multiple fins 112. It is also understood that fins 112 can be formed on substrate 102 by way of other techniques, some of which may include different masks 114 and/or may not include masks 114. Such methods can include, e.g., patterning a mandrel and thereafter forming fins 112 by epitaxial definition on substrate 102. A portion of substrate 102 with an exposed upper surface can laterally separate adjacent fins 112 from each other.

The terms "epitaxial growth and/or deposition" and "epitaxially formed and/or grown" mean the growth of a semiconductor material on a deposition surface of a semiconductor material, also known as a "seed layer," in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Figure 2:
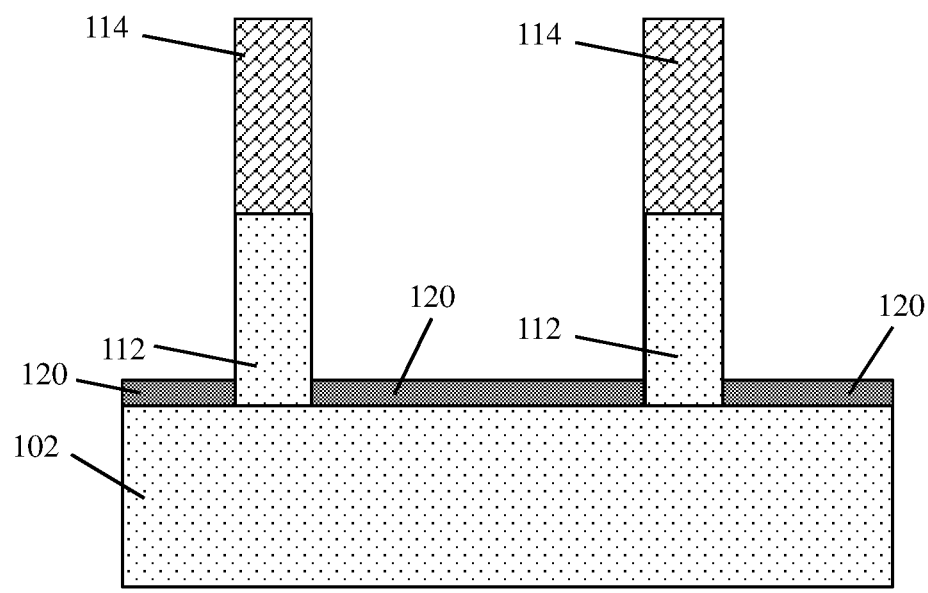
FIG. 2 provides a cross-sectional view of forming a spacer between semiconductor fins according to the disclosure.

Referring now to FIG. 2, a spacer 120 can be formed to physically and electrically separate fins 112 from each other.

According to an example, spacer 120 may be formed on substrate 102 between fins 112 by a combination of deposition and etching. Spacers 120 may include any conventional spacer material, for example, an oxide. As shown in FIG. 2, spacers 120 may overlie a portion of substrate 102 and can laterally abut vertical portions of respective fins 112.

Figure 3:
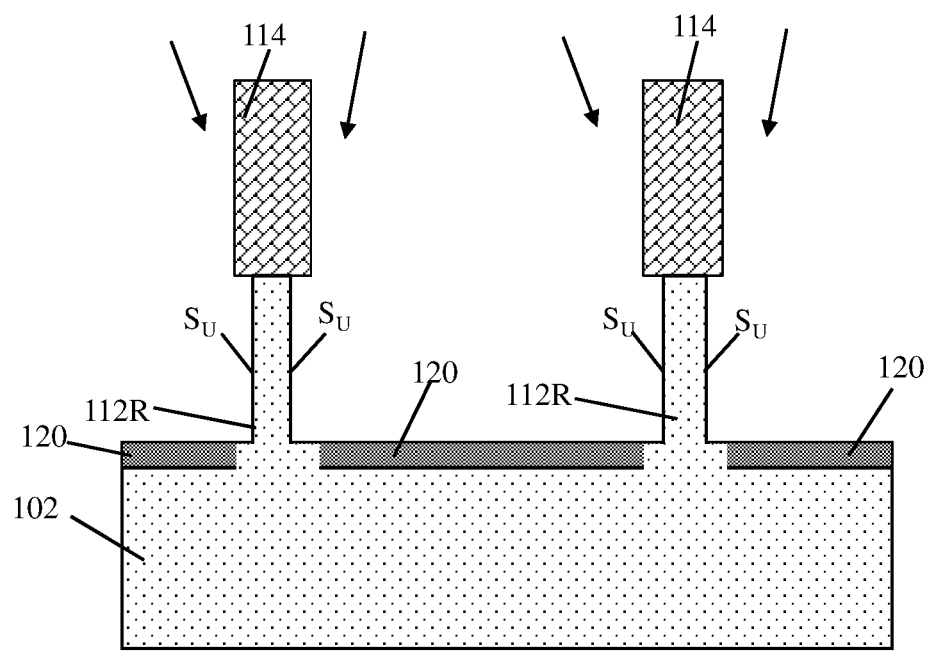
FIG. 3 provides a cross-sectional view of semiconductor fins being laterally recessed such that the fin masks overhang above the fins, according to the disclosure.

Turning to FIG. 3, embodiments of the disclosure can include removing a portion of fin(s) 112 (FIGS. 1-2) to form laterally recessed fins 112R between substrate 102 and fin masks 114. Portions of fins 112 can be laterally recessed to form recessed fins 112R by any currently-known or later developed process for removing targeted portions of semiconductor material. Although portions of fin 112 may laterally abut spacer 120, such portions of fin 112 may nevertheless be partially recessed as a result of reacting with one or more etching compounds and/or other materials for recessing fins 112. In such cases, fin 112 may have a non-uniform width and/or geometry alongside spacer 120 and directly above substrate 102. It is also understood that in some cases, fins 112 can be recessed to form recessed fins 112R before spacer 120 is formed, e.g., as shown in FIG. 2. Fin mask(s) 114 and spacer 120 can remain substantially intact because of fin(s) 112 being selectively etched or otherwise targeted for removal by application of one or more selective removal techniques described herein. Etching is one example of a process to form recessed fins 112R.

Etching generally refers to the removal of material from a substrate (or structures formed on the substrate), and is often performed with a mask in place so that material may selectively be removed from certain areas of the substrate, while leaving the material unaffected in other areas of the substrate. An etching process is depicted symbolically in FIG. 3 with downward-oriented arrows. There are generally two categories of etching, (i) wet etch, and (ii) dry etch. Wet etch is performed with a solvent (such as an acid or a base) which may be chosen for its ability to selectively dissolve a given material (such as oxide), while, leaving another material (such as polysilicon or nitride) relatively intact. This ability to selectively etch given materials is fundamental to many semiconductor fabrication processes. A wet etch will generally etch a homogeneous material (e.g., nitride) isotopically, but a wet etch may also etch single-crystal materials (e.g. silicon wafers) anisotopically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotopic. Ion milling, or sputter etching, bombards the wafer with energetic ions of noble gases that approach the wafer approximately from one direction, and therefore this process is highly anisotropic. Reactive-ion etching (RIE) operates under conditions intermediate between sputter and plasma etching and may be used to produce deep, narrow features, such as STI trenches. Recessed fins 112R can be formed by way of an isotropic etch, such that the width of each recessed fin 112R is substantially uniform in size.

To control the formation of recessed fins 112R, the amount of etchant and/or the total etching time can be controlled such that recessed fins 112R exhibit a substantially uniform thickness after being etched. In addition, fin masks 114 may remain substantially intact after the etching such that fin masks 114 each overhang above recessed fins 112R thereunder. Fin mask(s) 114 can substantially retain the original sidewall-to-sidewall thickness of fins 112 before the lateral recessing, while recessed fins 112R can have a smaller sidewall-to-sidewall thickness than corresponding fin mask(s) 114 positioned on their upper surface. Spacer 120 can remain in position on vertical surfaces of each recessed fin 112R, overlying substrate 102 thereunder. Recessed fins 112R can include exposed sidewalls positioned above spacer 120 and an upper surface of substrate 102. The resulting shape and size of recessed fins 112R can thus be appropriate to form a gate structure for a vertical FinFET pursuant to further processing described herein.

Figure 4:
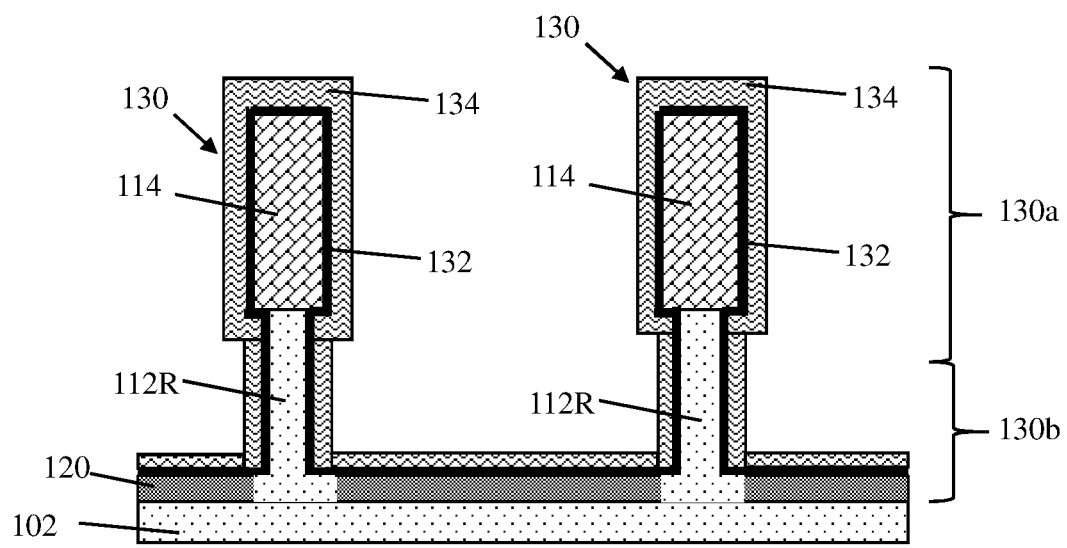
FIG. 4 provides a cross-sectional view forming a conformal gate liner on the fins and fin masks according to the disclosure.

Turning to FIG. 4, methods according to the disclosure can include forming a conformal gate liner 130 on and in contact with exposed vertical surfaces of recessed fins 112R, surfaces of the overlying fin mask(s) 114, and where applicable, exposed portions of spacer 120. Conformal gate liner 130 can include multiple layers of material. Specifically, conformal gate liner 130 can include, e.g., a thin and electrically insulating gate dielectric film 132 to physically separate other portions of conformal gate liner 130 from recessed fin 112R. As shown in the accompanying FIGS., conformal gate liner 130 can substantially mimic the geometrical profile of fins 112R, fin masks 114, and where applicable, spacer 120 as a result of being conformally deposited on exposed surfaces. In some cases, conformal gate liner 130 may be depicted with exaggerated dimensions or surface contours for emphasis and/or clarity of illustration. Gate dielectric film 132 may be composed of any insulating material such as $SiO_2$ or a "high-k" dielectric having a high dielectric constant, which may be, for example, above 3.9. Conformal gate liner 130 can also include a conductive gate layer 134 conformally formed (by, e.g., deposition and/or other suitable process) on exposed surfaces of gate dielectric film 132. Conductive gate layer 134 may include, e.g., any combination of conducting materials (e.g., metal, doped polycrystalline silicon, etc.) for providing an electrical junction to recessed fin(s) 112R to define a gate terminal of a transistor structure, e.g., to define and form a separation region within the corresponding recessed fin(s) 112.

The various components of conformal gate liner 130 can be formed by way of deposition and/or other currently-known or later developed procedure of forming conducting and dielectric materials, etc., such as conformally depositing gate dielectric film 132 on exposed surfaces followed by conformally depositing conductive gate layer 134 on gate dielectric film 132. It is also understood that different types of conformal gate liners 130 with different structures and/or combinations of materials can be formed without departing from the underlying concepts of the disclosure. Where applicable, spacer 120 can be positioned between conformal gate liner 130 and substrate 102 to structurally and electrically separation of distinct regions during operation of a device. Together, gate dielectric film 132 and conductive gate layer 134 define conformal gate liner 130 to be processed according to the present disclosure. Conformal gate liner 130 can be subdivided into two portions 130a, 130b, based on its position relative to fins 112R and fin masks 114. First portion 130a, as shown, can surround fin mask 114 after being conformally deposited thereon. Second portion 130b can surround recessed fins 112R. As shown, the thickness of first portion 130a on fin mask 114 and second portion 130b on fin 112R can be substantially uniform, such that the thickness of conformal gate liner 130 defines the separation between first and second portions 130a, 130b. Throughout the proceeding description, references to conformal gate liner 130 may collectively include gate dielectric film 132, conductive gate layer 134, first portion 130a, and second portion 130b except where otherwise noted.

Figure 5:
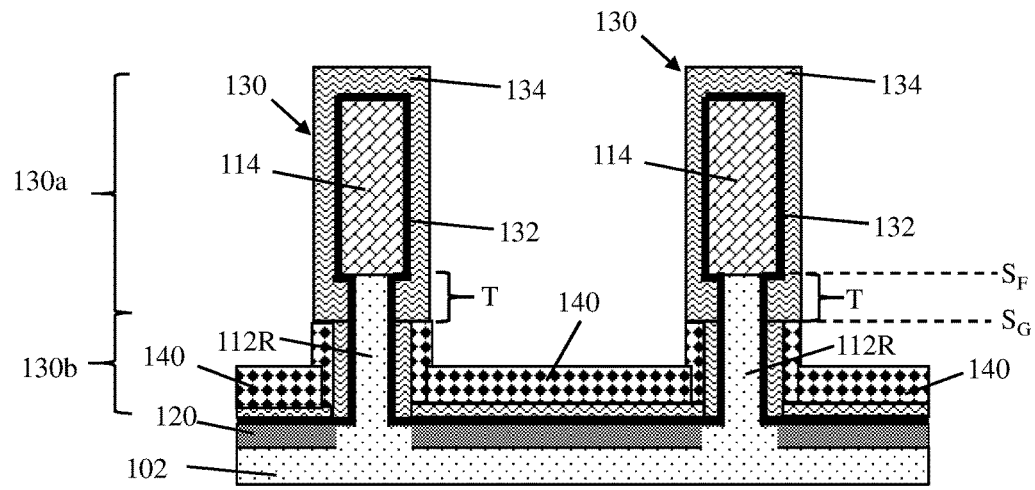
FIG. 5 provides a cross-sectional view of forming a gate mask adjacent to the conformal gate liner according to the disclosure.

Proceeding to FIG. 5, the disclosure can include forming a gate mask 140 on an upper surface and sidewalls of second portion 130*b* of conformal gate liner 130, such that first portion 130*a* of conformal gate liner 130 covers an underlying portion of gate mask 140. Gate mask 140, in turn, can cover and be positioned over part of second portion 130*b* of conformal gate liner 130. Gate mask 140 can include one or more currently known or later developed substances, e.g., an organic planarization layer (OPL), soft masking material, and/or other photoresist materials configured to protect underlying components and being able to withstand lithographic processing of integrated circuit materials.

Gate mask 140 can initially be deposited as a single layer to cover fin masks 114, and fill any vacant space between fins 112R. After being formed, the initial layer of masking material can be recessed down directionally, and selectively to conformal gate liner 130, to below the lower surface of the first portion 130*a*. Etching the masking material in this manner will leave a vertical portion of masking material against sidewalls of second portion 130*b*, and beneath first portion 130*a*, to form a substantially U-shaped or substantially L-shaped gate mask 140. In other words, gate mask 140 can include a first region positioned above substrate 102, spacer 120, and lateral portions of conformal gate liner 130 with height equal to or lower than a height of gate mask 140 positioned alongside sidewall surfaces of conformal gate liner 130. The formed gate mask 140 can be directly adjacent to each portion 130*a*, 130*b* of conformal gate liner 130 while covering lateral portions of conformal gate liner 130 adjacent to recessed fins 112R. Gate mask 140 can thus be positioned over lateral surfaces and adjacent to sidewalls of second portion 130*b* of conformal gate liner 130, with first portion 130*a* of conformal gate liner 130 being exposed. An initial thickness T of conformal gate liner 130 can separate an uppermost surface $S_G$ of gate mask 140 from a lowermost surface $S_F$ of fin mask(s) 114. Thus, the initial thickness of conformal gate liner 130 can set a limit on the size of subsequently formed gate regions in further processing according to the disclosure. According to an example, thickness T may be between, e.g., approximately six nanometers (nm) and approximately eight nm.

Figure 6:
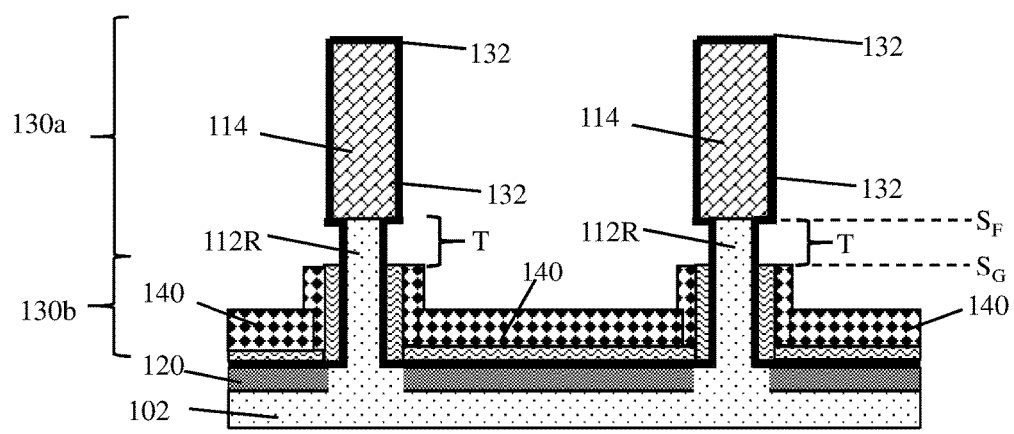
FIG. 6 provides a cross-sectional view of removing some exposed portions of the conformal gate liner according to the disclosure.
Figure 7:
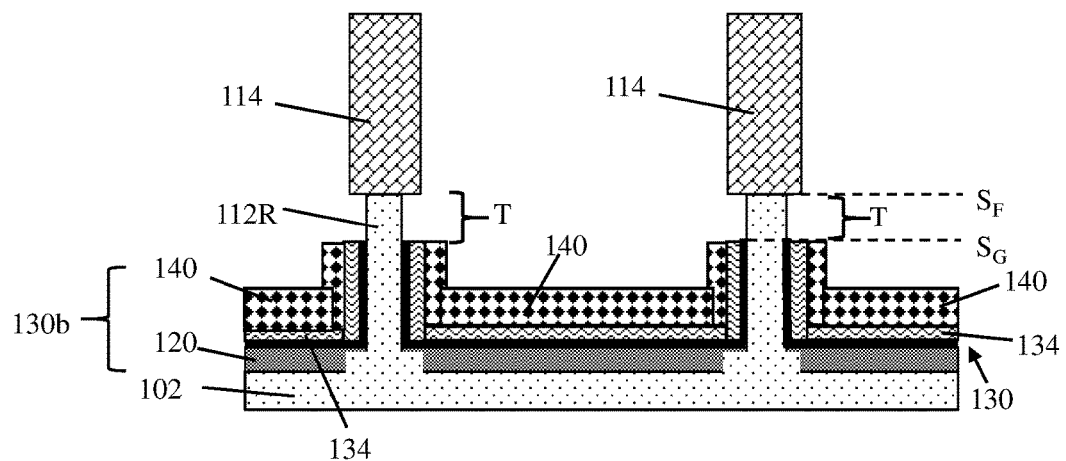
FIG. 7 provides a cross-sectional view of removing a remaining gate dielectric of the conformal gate liner according to the disclosure.

Referring now to FIGS. 6-7 together, gate mask 140 can protect underlying portions of material, e.g., second portion 130*b* of conformal gate liner 130, from being removed according to subsequent processing. First portion 130*a* of conformal gate liner 130 can then be removed without affecting second portion 130*b* beneath gate mask 140. In an example implementation, portions of conductive gate layer 134 (FIGS. 4-5) in first portion 130*a*, i.e., not covered by gate mask 140 and/or not laterally abutting gate mask 140, be removed by selective or non-selective etching. As shown specifically in FIG. 6, removing conductive gate layer 134 above gate mask 140 can expose underlying portions of gate dielectric film 132 positioned on recessed fins 112R and fin masks 114 above gate mask 140. As shown specifically in FIG. 7, the remaining gate dielectric film 132 in first portion 130*a* positioned above gate mask 140 can then be removed, e.g., by continued etching and/or different processes for removing dielectric materials, to uncover portions of recessed fin(s) 112R and fin masks 114 previously coated by first portion 130*a* of conformal gate liner. Gate dielectric film 132 and conductive gate layer 134 included within second portion 130*b* of conformal gate liner 130 can remain substantially intact by being shielded by gate mask 140. After first portion 130*a* of conformal gate liner 130 is removed, the initial thickness T of first portion 130*a* of conformal gate liner 130 can separate uppermost surface $S_G$ of the remaining gate dielectric film 132 and conductive gate layer 134 of second portion 130*b* from the lowermost surface $S_F$ of fin mask(s) 114.

Figure 8:
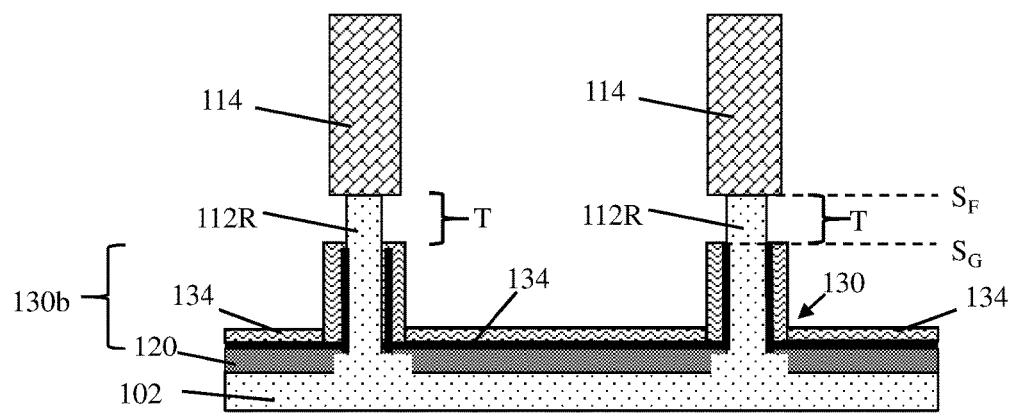
FIG. 8 provides a cross-sectional view of removing the gate mask according to the disclosure.

Turning now to FIG. 8, embodiments of the disclosure can include selectively removing gate mask 140 to expose the remaining second portion 130*b* of conformal gate liner 130. Gate mask 140 can be removed by way of any currently-known or later developed technique for removing a layer of masking material. Methods according to the disclosure can include, e.g., stripping gate mask(s) 140 by one or more currently-known or later developed processes of removing a material from an integrated circuit structure without patterning the underlying materials. The remaining of second portion 130*b* of conformal gate liner 130 can include the remaining areas of gate dielectric film 132 and conductive gate layer 134. Further processes for removing gate mask(s) 140 may include, e.g., ashing in addition to one or more removal processes discussed herein. Ashing generally refers to the selective removal of insulating and/or organic elements by volatilization, e.g., by using one or more strongly oxidizing ambient materials or techniques (e.g., oxygen plasma ashing). As discussed elsewhere herein, a gate contact to second portion 130*b* of conformal gate liner 130, formed, e.g., between recessed fin 112R and a neighboring recessed fin 112R over substrate 102, can be formed to provide a vertical FinFET structure.

Figure 9:
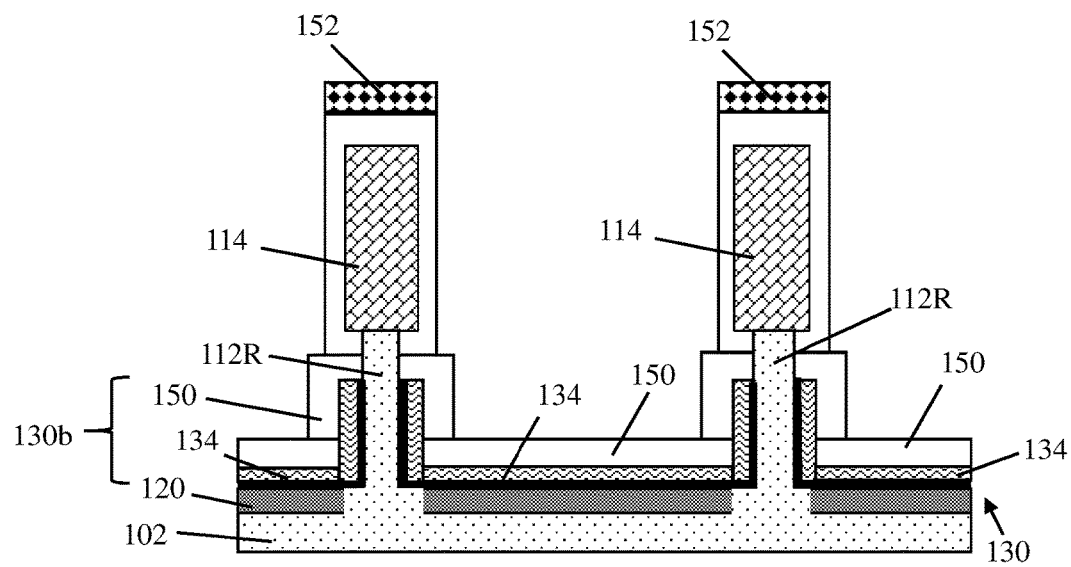
FIG. 9 provides a cross-sectional view of forming a nitride liner and intermediate mask according to the disclosure.

Turning to FIG. 9, additional processes are shown to further illustrate the application of using conformal gate liner 130 to define the gate length in vertical FinFETs. For example, the disclosure can include forming a nitride liner 150 (composed, e.g., of one or more electrically insulating nitride compounds currently known or later developed) on second portion 130*b* of conformal gate liner 130, in addition to exposed surfaces of recessed fin(s) 112R and fin mask(s) 114, after removing gate mask 140. Nitride liner 150 can physically and electrically separate recessed fin(s) 112R and conformal gate liner(s) 130 from subsequently formed structures. To target portions of conformal gate liner 130 and nitride liner 150 adjacent to recessed fins(s) 112R for subsequent processing and removal, embodiments of the disclosure can include forming an intermediate mask 152 on nitride liner(s) 150. After being formed, intermediate mask(s) 152 can be positioned above recessed fins 112R and corresponding fin masks 114. Intermediate mask(s) 152 can be sized to vertically cover vertically-oriented portions of conformal gate liner 130 and nitride liner 150 adjacent to one recessed fin 112R. Intermediate mask(s) 152 can thus protect underlying portions of nitride liner(s) 150, as well as gate dielectric film 132 and conductive gate layer 134, from being removed in a subsequent directional etching of the structure. Intermediate mask 152 can include one or more of the example masking materials described herein relative to gate mask 140 (FIGS. 5-7), or may be formed from any other masking material appropriate for protecting recessed fin(s) 112R and/or fin mask(s) 114.

Figure 10:
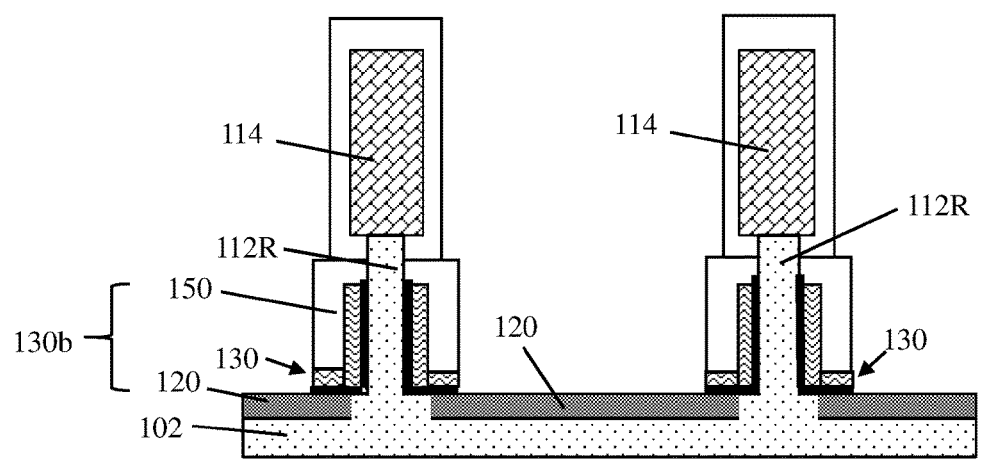
FIG. 10 provides a cross-sectional view of portions of the nitride liner being removed adjacent to the fins according to the disclosure.

Referring to FIG. 10, portions of conformal gate liner 130 adjacent to fins 112R, and not vertically covered by intermediate mask(S) 152 as discussed herein, can be removed while other portions of the same material vertically covered and protected by intermediate mask(s) 152 can remain intact. Directional etching can be used to remove exposed materials, e.g., nitride liner 150, gate dielectric film 132, and/or conductive gate layer 134 not covered by intermediate mask(s) 152. After the targeted materials have been removed, intermediate mask(s) 152 can be removed, e.g., by mask stripping and/or other techniques appropriate for removing masking materials from a structure. Portions of conformal gate liner 130 and nitride liner 140 positioned beneath intermediate mask(s) 152 can remain intact, after the etching.

Figure 11:
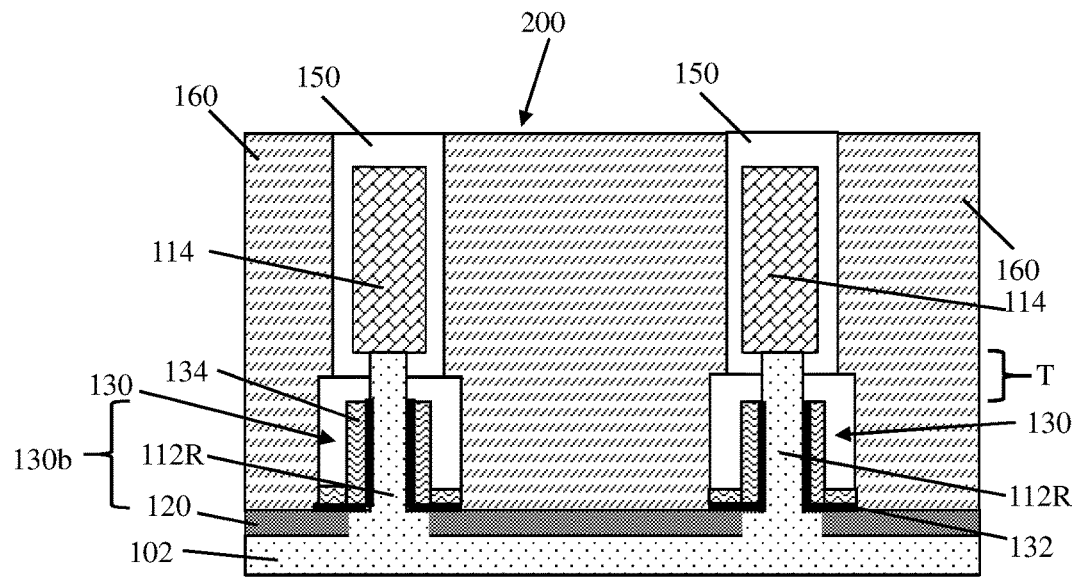
FIG. 11 provides a cross-sectional view of forming an inter-level dielectric (ILD) according to the disclosure.

Turning now to FIG. 11, further processing according to the disclosure can include forming an inter-level dielectric material (ILD) 160 laterally adjacent to recessed fins 112R, such that ILD 160 covers nitride liner 150 and underlying portions of conformal gate liner 130. ILD 160 can include one or more layers, films, etc., of dielectric material appropriate for structurally separating distinct layers of an IC structure, and to form a barrier to subsequently formed vertical FinFETs. Further processing according to the disclosure can include targeting fin mask(s) 114 for replacement with semiconductor structures to define source/drain terminals of a device. As noted elsewhere herein, fin mask(s) 114 can be removed by etching, and then replaced by a deposited or epitaxially grown later of doped semiconductor material. A structure 200 resulting from the processes described herein can include the remaining second portion 130b of conformal gate liner 130 vertically separated from fin mask(s) 114 by thickness T of conformal gate liner 130 in the initially formed first region 130a. Processes according to the disclosure can be effective for controlling or otherwise limiting the length (measured, e.g., vertically from substrate 102) of gate dielectric films 132 and conductive gate layers 134 which form part of a vertical FinFET structure.

Before proceeding to subsequent FIGS., it is noted that some of the other FIGS. 12-36 illustrate the result of multiple intermediate processes being applied to other structures, e.g., one or more structures illustrated in a preceding illustration. Such depictions of multiple process steps are provided relative to the implementation of multiple processing techniques discussed herein relative to FIGS. 1-11. It is therefore understood that the various techniques described herein relative to one or more or FIGS. 1-11 may be applied and depicted together in one of FIGS. 12-36, and that the various processing techniques described herein may be combined and/or substituted where appropriate without departing from the underlying technical concepts and characteristics of the present disclosure. It is again emphasized that the processes discussed herein and shown in the accompanying FIGS. 1-36 reflect a similar or identical set of processing concepts with possible variances in implementation, discussed herein.

Figure 12:
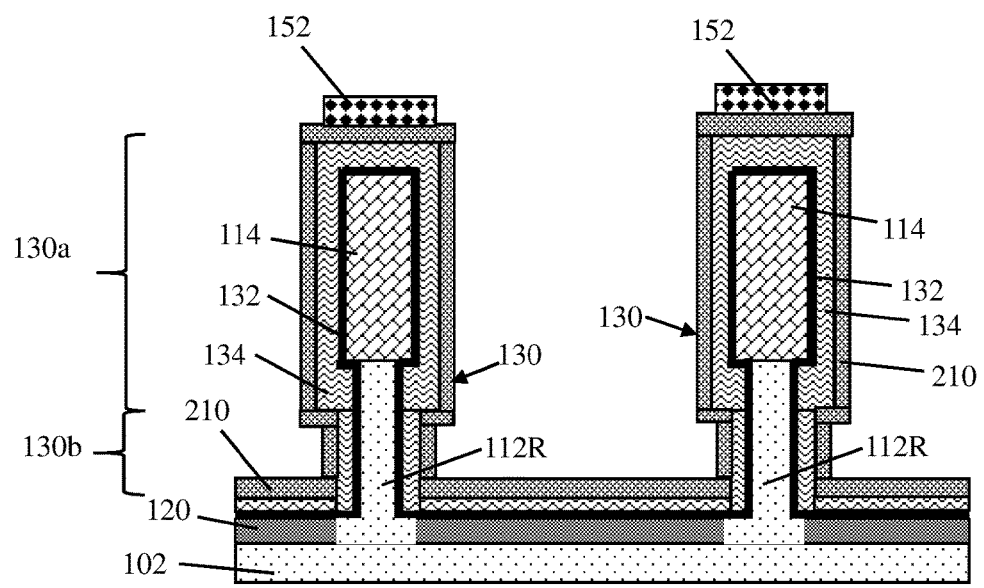
FIG. 12 provides a cross-sectional view of forming an inner spacer and intermediate mask on the conformal gate liner according to further implementations of the disclosure.

As opposed to embodiments discussed above, in which conformal gate liner 130 is processed to define the size of a transistor gate before removing other portions of conformal gate liner 130 adjacent to recessed fins 112R, embodiments of the disclosure may include reversing the order of these processes. For example, forming a vertical FinFET according to the disclosure can include removing portions of conformal gate liner 130 before using conformal gate liner 130 to define the size of a transistor gate by modifying or changing the order of other processes described herein. Referring to FIGS. 5 and 12 together, the disclosure can include forming an inner spacer 210 on conductive gate layer 134 of conformal gate liner 130 before masking or removing any part of conformal gate liner 130. Inner spacer 210 can be formed by any currently known or later developed process for conformally forming a spacer material on exposed structures. In particular, inner spacer 210 can be formed by conformal deposition on exposed surfaces of conductive gate layer 134.

Inner spacer 210 can include, e.g., one or more electrically insulating materials including, without limitation, one or more oxide compounds, nitride compounds, etc. According to an embodiment, inner spacer 210 may include a silicon nitride (SiN) material. In addition to the foregoing, inner spacer 210 can include, e.g., any material conventionally used for a layer of insulating material for vertically separating two layers such as silicon nitride, silicon oxide, fluorinated silicon dioxide (FSG), hydrogenated silicon oxycarbide, porous silicon oxycarbide, boro-phospho-silicate glass (BPSG), silsesquioxanes, carbon doped oxides (i.e., organosilicates) that include atoms of silicon, carbon, oxygen, and/or hydrogen, thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

After inner spacer 210 is formed, portions of conformal gate liner 130 between fins 112R can be selectively removed. First, a set of intermediate mask(s) 152 can be formed on inner spacer 210 to vertically cover vertically-oriented portions of conformal gate liner 130 and inner spacer 210, and to protect materials underneath the covered portions of inner spacer 210 from being processed. Intermediate mask(s) 152 can contact and overlie inner spacer 210, with conductive gate layer 134 being positioned below inner spacer 210 and gate dielectric film 132 being positioned below conductive gate layer 134 as discussed above. Intermediate mask(s) 152 can be positioned over corresponding fin mask(s) 114 as a result of being formed on the top of inner spacer 210. Subsequent processing of the structure can include directionally etching materials not covered by intermediate mask(s) 152. Forming intermediate mask(s) 152 protects the covered portions of inner spacer 210 and the underlying portions of fin mask 114, gate dielectric film 132, and conductive gate layer 134 from being removed during these subsequent processes.

Intermediate mask(s) 152 can be absent from the space above substrate 102 between neighboring recessed fins 112R. Intermediate mask(s) 152 can also be sized such that portions of inner spacer 210 lateral to the sidewalls of fin mask(s) 114 are not covered by intermediate mask 152. Subsequent processing of the structure can include using intermediate mask(s) 152 to target and remove portions of gate dielectric film 132, conductive gate layer 134, and inner spacer 210 not covered by intermediate mask(s) 152. Other portions of these materials positioned below intermediate mask(s) 152, including first and second portions 130a, 130b, can remain intact during the directional etching.

Figure 13:
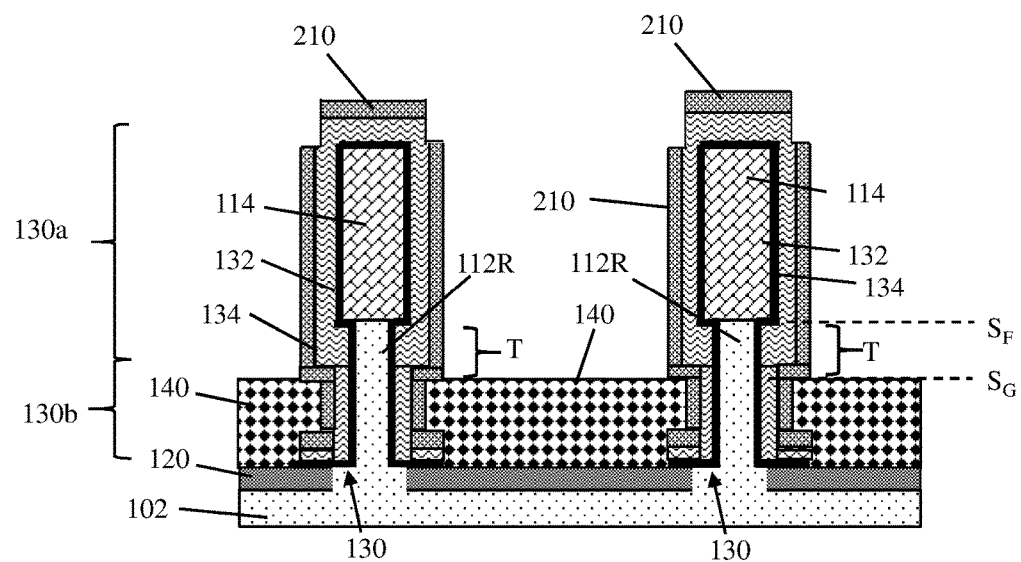
FIG. 13 provides a cross-sectional view of removing portions of the inner spacer and conformal gate liner and forming a gate mask according to further implementations of the disclosure.

Turning to FIG. 13, processes are shown for directional etching of inner spacer 210, and gate dielectric film 132 and conductive gate layer 134 of conformal gate liner 130, not covered with intermediate masks 152. Removing gate liner 130 and inner spacer 210 between recessed fins 112R can expose underlying portions of spacer 120 and/or portions of substrate 102. In this example, gate mask 140 can be formed after removing portions of inner spacer 210, gate dielectric film 132, and gate conductive layer 134 with the aid of intermediate masks 152. Despite this difference in the ordering of processes, gate mask 140 can be formed laterally between recessed fins 112R in the same manner described above relative to FIGS. 6-8. Although inner spacer 210 is formed before gate mask 140 in this case, gate mask 140 can laterally abut remaining portions of inner spacer 210 such that inner spacer 210 is laterally interposed between conformal gate liner 130 and gate mask 140. As noted relative to the processes shown in FIGS. 6-8, gate mask 140 can be sized such that thickness T of conformal gate liner 130 within first portion 130a separates the lowermost surface $S_F$ of each fin mask 114 from the uppermost surface $S_G$ of gate mask 140. Gate mask 140 thus can cover and laterally abut second portion 130b of conformal gate liner 130 and portions of inner spacer 210 which coat second portion 130b. First portion 130a of conformal gate liner 130a and portions of inner spacer 210 which coat first portion 130a can remain exposed above gate mask 140.

Figure 14:
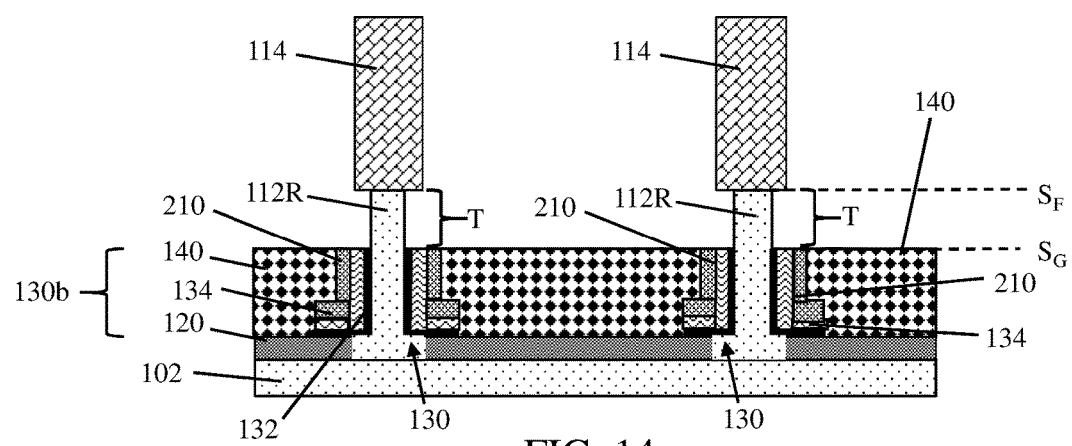
FIG. 14 provides a cross-sectional view of removing the conformal gate liner above the gate mask according to further implementations of the disclosure.

Referring now to FIG. 14, embodiments of the disclosure can include removing portions of conformal gate liner 130 and inner spacer 210 not covered by gate masks 140. First portion 130a of conformal gate liner 130 and portions of inner spacer 210 which coat first portion 130a can be removed in accordance with the processes for removing conformal gate liner 130 described elsewhere herein, e.g., relative to FIGS. 6-8. A single or repeated etching can remove first portion 130a of conformal gate liner 130 and portions of inner spacer 210 which coat first portion 130a to expose underlying portions of recessed fins 112R and fin masks 114 not covered by gate mask 140. Second portion 130b of conformal gate liner 130 and portions of inner spacer 210 can remain intact beneath gate mask 140. As noted with respect to other processes described herein, removing first portion 130a of conformal gate liner and portions of inner spacer 210 above gate mask 210 can cause thickness T of conformal gate liner 130 to separate fin masks 114 from conformal gate liner 130. Regardless of any differences in the ordering of processes, the thickness of conformal gate liner 130 defines thickness T between second portion 130b of conformal gate liner 130 and fin masks 114, thereby limiting the size of the remainder of conformal gate liner 130.

Figure 15:
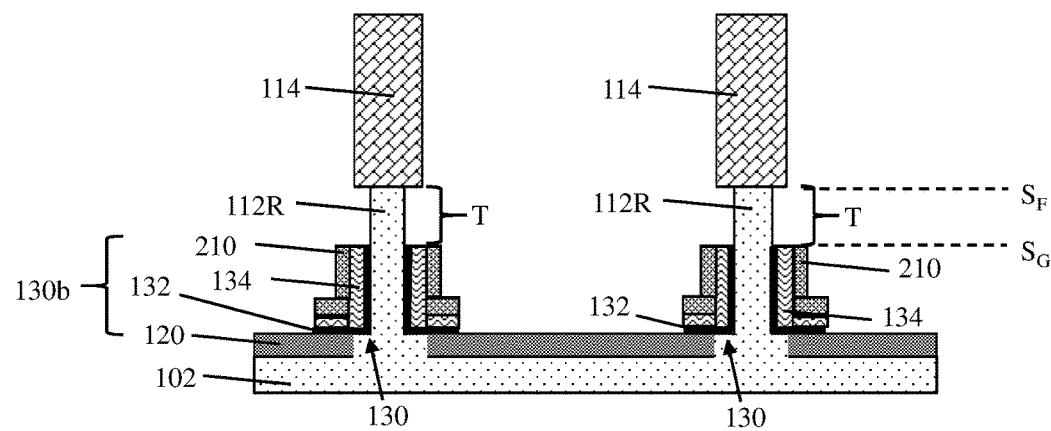
FIG. 15 provides a cross-sectional view of removing the gate mask according to further implementations of the disclosure.
Figure 16:
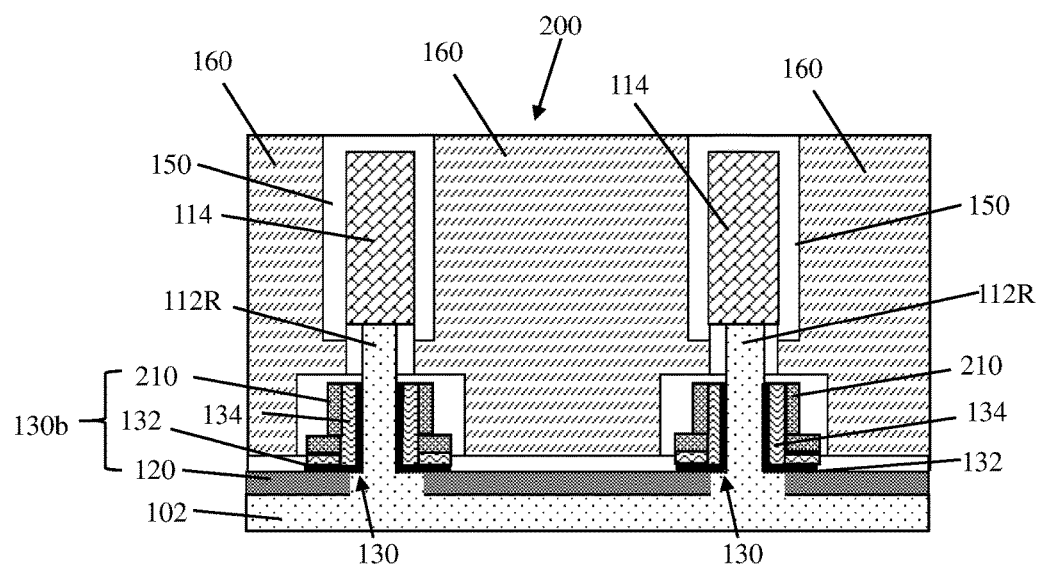
FIG. 16 provides a cross-sectional view of forming an insulative liner and ILD according to further implementations of the disclosure.

Referring to FIGS. 15 and 16 together, embodiments of the disclosure can include further processing of the resulting structure substantially in accordance with other processes and/or embodiments described herein. FIG. 15, for example, depicts a process of removing gate mask 140 to expose the remaining second portion 130b of conformal gate liner 130 and inner spacer 210, according to other processes discussed herein. Gate mask 140 can be removed substantially by way of stripping and/or otherwise selectively removing any masking materials positioned over substrate 102. FIG. 16 illustrates the subsequent formation of nitride liner 150 on exposed surfaces of recessed fins 112R, fin masks 114, conformal gate liner 130, inner spacer 210, etc., before forming ILD 160 thereon. The resulting IC structure 200 can include a remaining portion of inner spacer 210 on second portion 130b of conformal gate liner 130, e.g., as a result of processing variations, but otherwise may be structurally similar or identical to other IC structures 200 discussed herein (e.g., relative to FIG. 11). IC structure 200 can then be processed into a vertical FinFET structure with vertical separation between conformal gate liner 130 and subsequently formed source/drain regions by one or more processes discussed herein or known in the art to form a vertical FinFET structure from semiconductor material.

Figure 17:
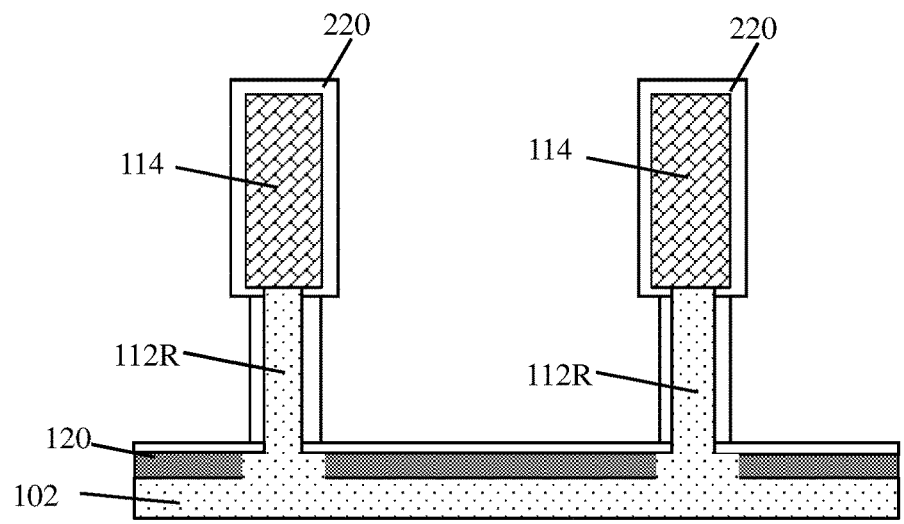
FIG. 17 provides a cross-sectional view of forming a sacrificial insulator on the recessed semiconductor fins and fin mask according to further implementations of the disclosure.

The various embodiments discussed herein have proposed a "gate last" processing scheme with fin masks 114 remaining in place as conformal gate liner 130 is formed. Referring to FIGS. 3 and 17 together, further processing according to the disclosure can provide a "gate first" processing scheme. The various embodiments discussed herein relative to FIGS. 4-16, for example, may be modified to accommodate situations where fin mask 114 is replaced with a source/drain region after gate materials have previously been formed. The embodiments herein can also provide for controlling the size of a gate in a vertical FinFET when the source/drain material of the transistor is formed before the gate. As with other embodiments, the thickness of conformal gate liner 130 can separate the resulting source/drain regions on each semiconductor fin from the underlying remainder of conformal gate liner 130.

FIG. 17 illustrates a process of further modifying the structure of FIG. 3 to prepare for source/drain formation on recessed fin(s) 112R. After recessed fins 112R and spacer 120 have been formed, the disclosure can include, e.g., forming a set of sacrificial liners 220 on exposed surfaces of recessed fins 112R, fin mask 114, and where applicable, spacer 120. Sacrificial liners 220 can include any electrically insulating materials described herein, and in an example may be formed from one or more oxide materials (e.g., silicon dioxide ($SiO_2$)). Sacrificial liners 220 can be formed to conformally coat surfaces of recessed fins 112R and fin mask 114 by way of deposition to protect the coated materials from being affected by subsequently-formed regions of material.

Figure 18:
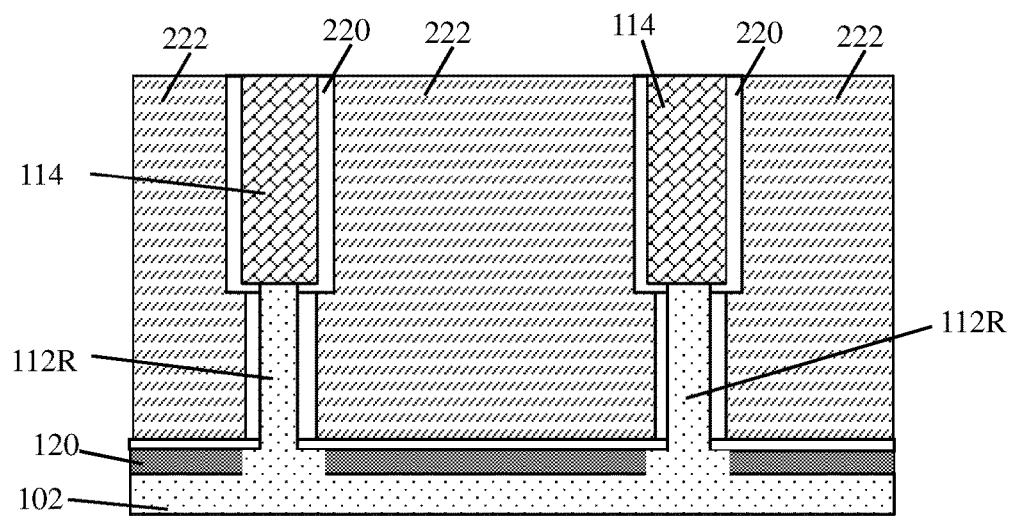
FIG. 18 provides a cross-sectional view of forming a sacrificial dielectric layer according to further implementations of the disclosure.

Referring to FIG. 18, the disclosure can include forming a sacrificial dielectric layer 222 above substrate 102, proximate recessed fins 112R and fin masks 114. Where sacrificial liners 220 are previously formed, sacrificial dielectric layer 222 can be positioned directly in contact with sacrificial liners 220. Sacrificial dielectric layer 222 can serve as a preliminary ILD material to permit removal and replacement of fin masks 114. Sacrificial dielectric layer 222 can then be removed to allow the forming and processing of other structures. Sacrificial dielectric layer 222 can be formed by way of deposition and/or any other process of forming an insulative material. After forming sacrificial dielectric layer 222, the upper surfaces of fin mask(s) 114, sacrificial liner(s) 220, and sacrificial dielectric layer 222 can be planarized (e.g., by application of chemical mechanical polishing (CMP) or similar process) to cause an upper surface of fin mask(s) 114 to be substantially coplanar with an upper surface of sacrificial dielectric layer 222, as shown in FIG. 18.

Figure 19:
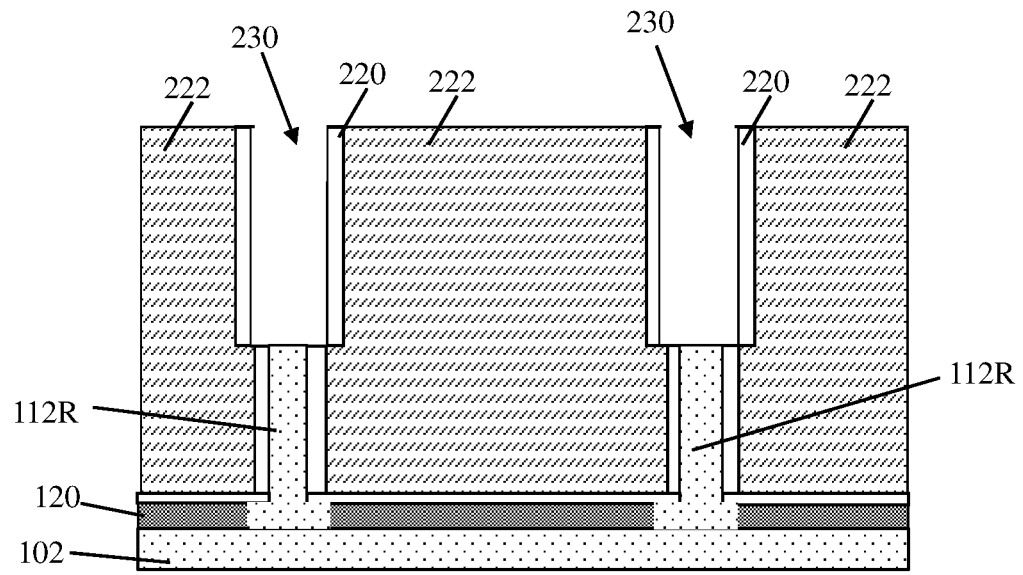
FIG. 19 provides a cross-sectional view of removing the fin masks according to further implementations of the disclosure.

Turning to FIG. 19, the present disclosure can include further processing to replace fin masks 114 (FIGS. 1-18) with source/drain elements of a vertical FinFET. As shown, fin masks 114 can be removed by way of selective etching and/or other techniques for removing the masking material of fin masks 114 from a structure while leaving other materials (e.g., sacrificial liners 220 and sacrificial dielectric layer 222) substantially intact. An example of such processing can include, e.g., selectively etching the composition of fin masks 114 (which may include, e.g., nitride) with a nitride-selective wet etchant to leave other materials (e.g., oxide compounds of sacrificial liners 220 and/or sacrificial dielectric layer 222) substantially intact. The location from which fin masks 114 are removed can define one or more cavities 230 positioned over recessed fins 112R. Removing fin masks 114 can expose an upper surface of each underlying recessed fin 112R at the bottom of a corresponding cavity 230.

Figure 20:
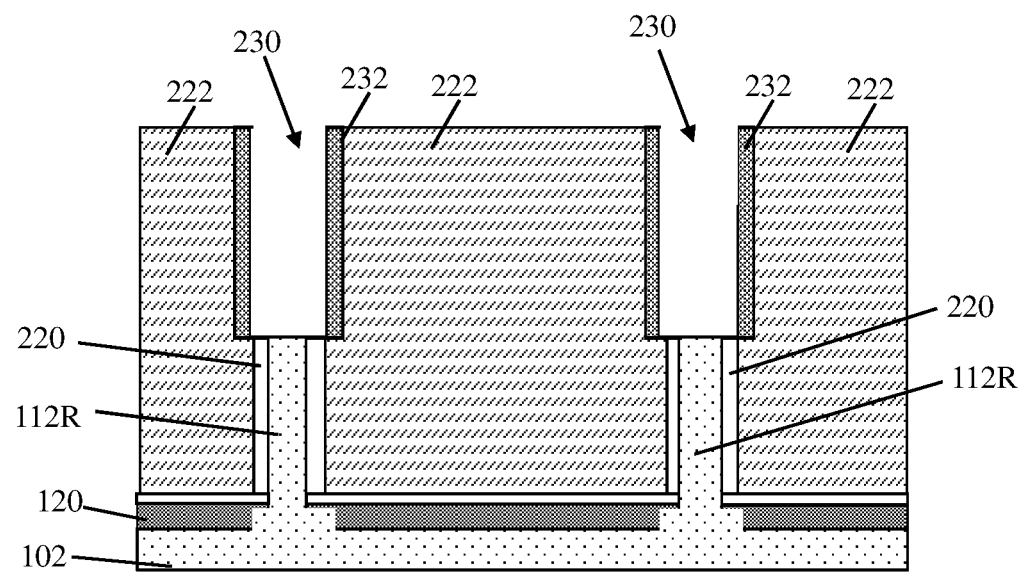
FIG. 20 provides a cross-sectional view of forming a set of source/drain spacers according to further implementations of the disclosure.

Referring to FIG. 20, the disclosure can include further processing before source/drain elements of a transistor are formed. In particular, the disclosure may include selectively removing portions of sacrificial liners 220 within each cavity, e.g., by way of a selective or non-selective etching of sacrificial liners 220. In the case of a non-selective etch, differences in the etch rate of sacrificial liners 220 and sacrificial dielectric layer 222 can cause sacrificial liners 220 to be quickly removed without substantially affecting sacrificial dielectric layer 222. Methods according to the disclosure can include subsequently forming, e.g., by selective deposition on insulator materials, one or more source/drain spacers 232 on sidewalls of cavity 230 as shown in FIG. 20.

Selective deposition may prevent source/drain spacers 232 from being formed on exposed portions of recessed fin 112R within cavity 230. In the case of non-selective deposition, source/drain spacers 232 can be subsequently etched to remove portions thereof positioned on recessed fin(s) 112R.

Figure 21:
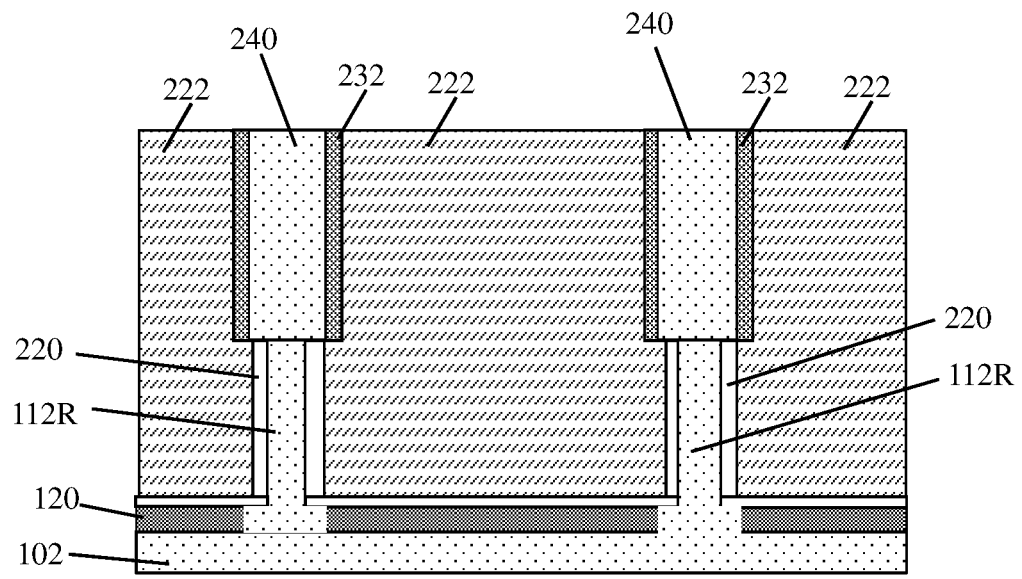
FIG. 21 provides a cross-sectional view of growing source/drain regions on the semiconductor fins according to further implementations of the disclosure.

Continuing to FIG. 21, embodiments of the disclosure can include, e.g., forming one or more source/drain regions 240 on the exposed upper surface of recessed fin 112R. Source/drain region 240 can include any currently known or later developed semiconductor material, which may include dopants therein, and thus may have a similar or identical composition relative to substrate 102 and/or recessed fins 112R. Source/drain regions 240 may be formed, e.g., by deposition or epitaxial growth. In the case of epitaxial growth, a region of material suitable for use as a source/drain region of a transistor may be formed directly on recessed fin(s) 112R, and laterally adjacent to inner spacer(s) 210, to substantially fill recess(es) 230 (FIGS. 18-19) formed by earlier processing. Source/drain region(s) 240 may include, for example, silicon, silicon germanium, or silicon carbon and may be doped with conventional n-type or p-type dopants. Source/drain regions 240 may be formed such that each source/drain region 240 completely fills a corresponding recess 230 and overlies recessed fin 112R in substantially the same position as fin mask(s) 114 (FIGS. 1-18). In still further embodiments, an operator can change the properties and/or composition of epitaxial layer 130 by forming a layer of dopants (not shown) thereon, and then annealing the layer of dopants. Such annealing can cause dopants to diffuse into source/drain regions 240 to change its conductivity and/or other properties, e.g., to provide higher electrical conductivity through source/drain regions 240 during operation.

Figure 22:
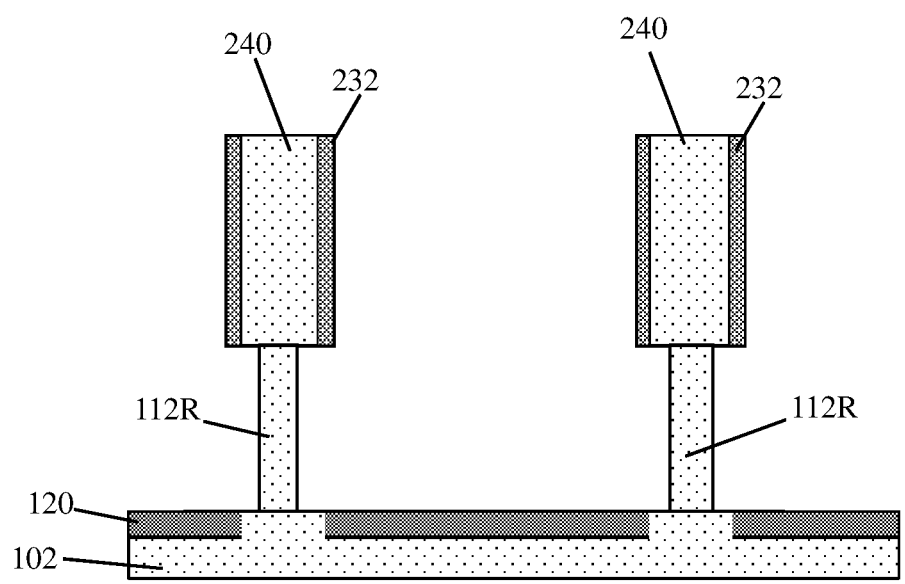
FIG. 22 provides a cross-sectional view of removing the sacrificial dielectric layer according to further implementations of the disclosure.
Figure 23:
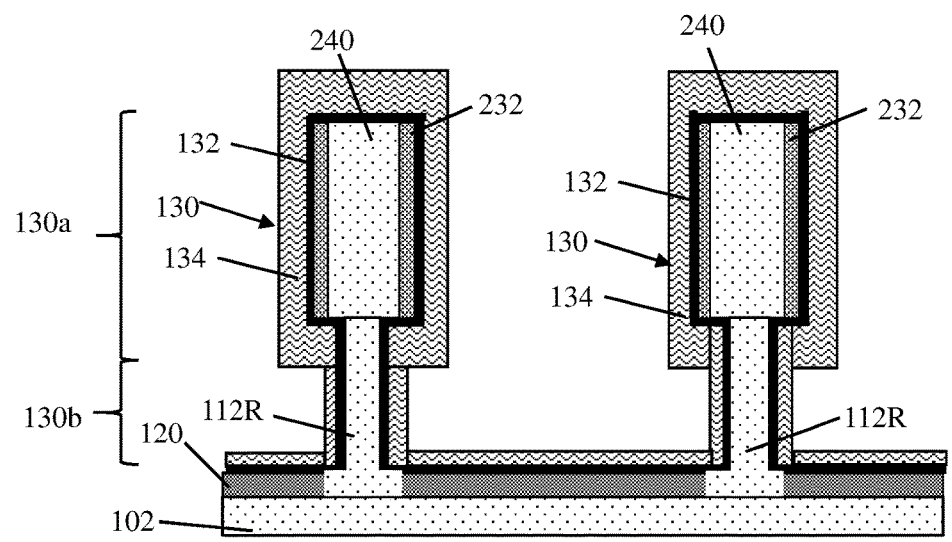
FIG. 23 provides a cross-sectional view of forming an initial conformal gate liner on the semiconductor fins and source/drain regions according to further implementations of the disclosure.
Figure 24:
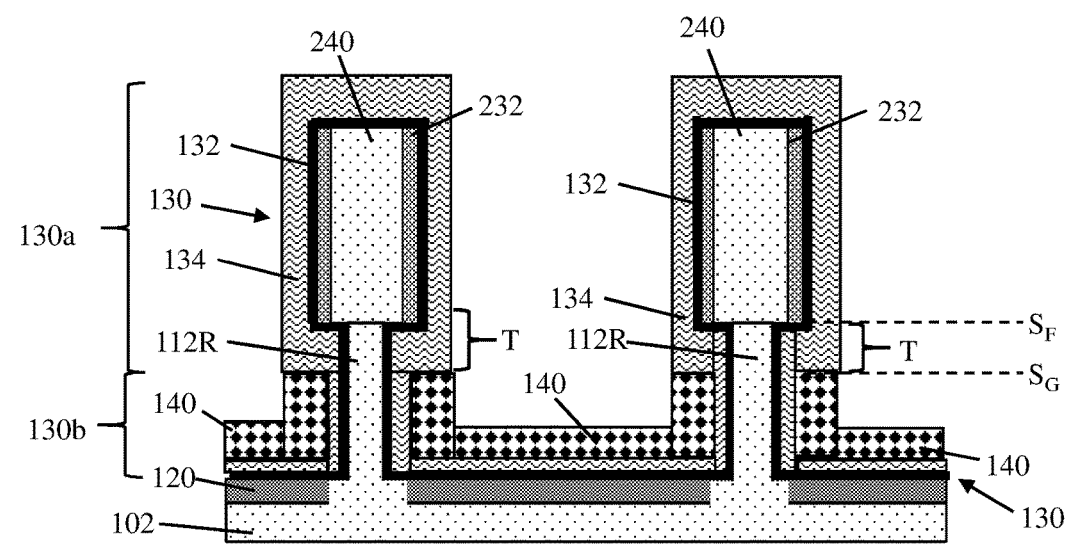
FIG. 24 provides a cross-sectional view of forming a gate mask between the semiconductor fins according to further implementations of the disclosure.
Figure 25:
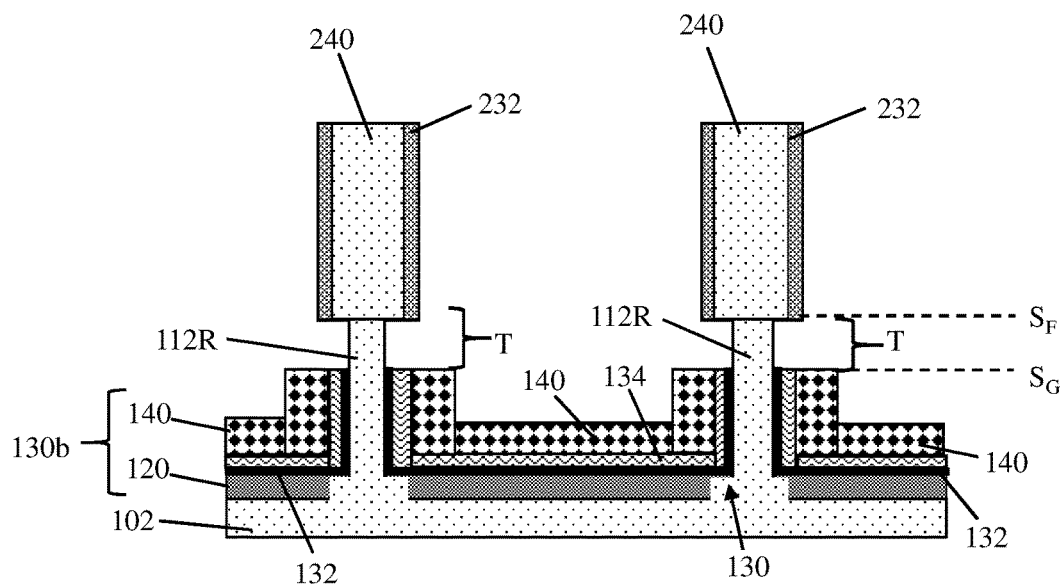
FIG. 25 provides a cross-sectional view of removing portions of the initial conformal gate liner above the gate mask according to further implementations of the disclosure.
Figure 26:
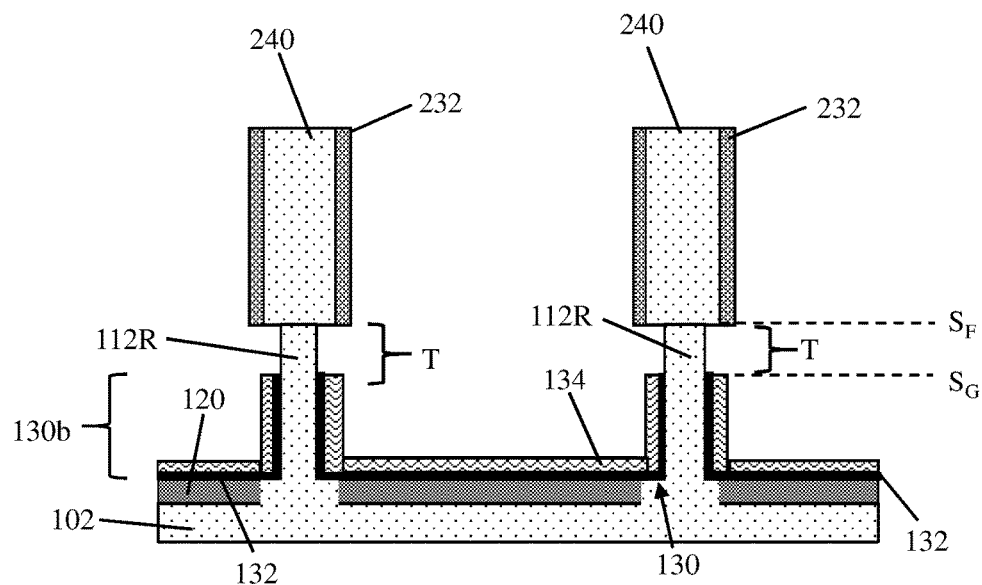
FIG. 26 provides a cross-sectional view of removing the gate mask according to further implementations of the disclosure.
Figure 27:
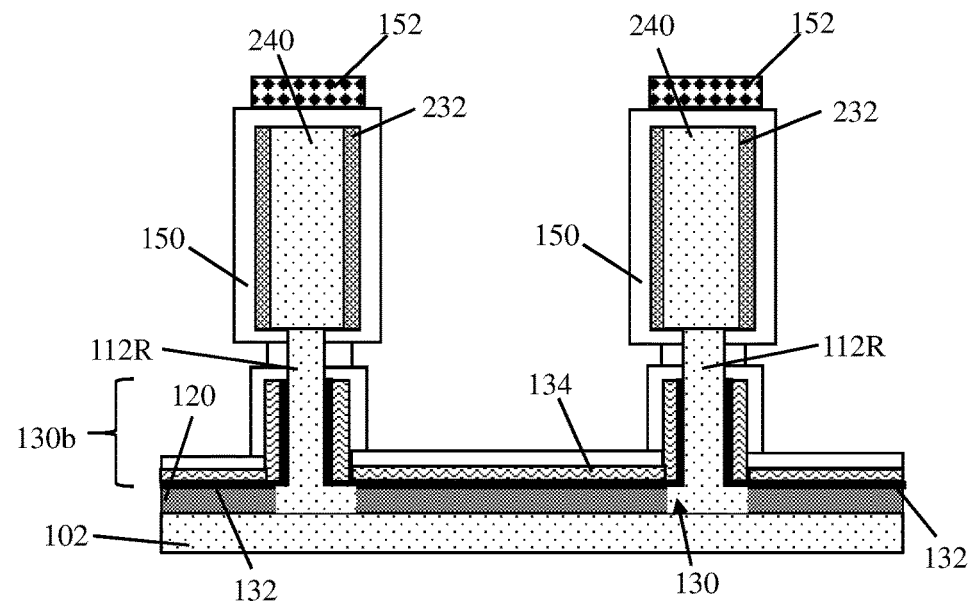
FIG. 27 provides a cross-sectional view of forming a cross-sectional view of forming a nitride liner and intermediate mask according to further implementations of the disclosure.
Figure 28:
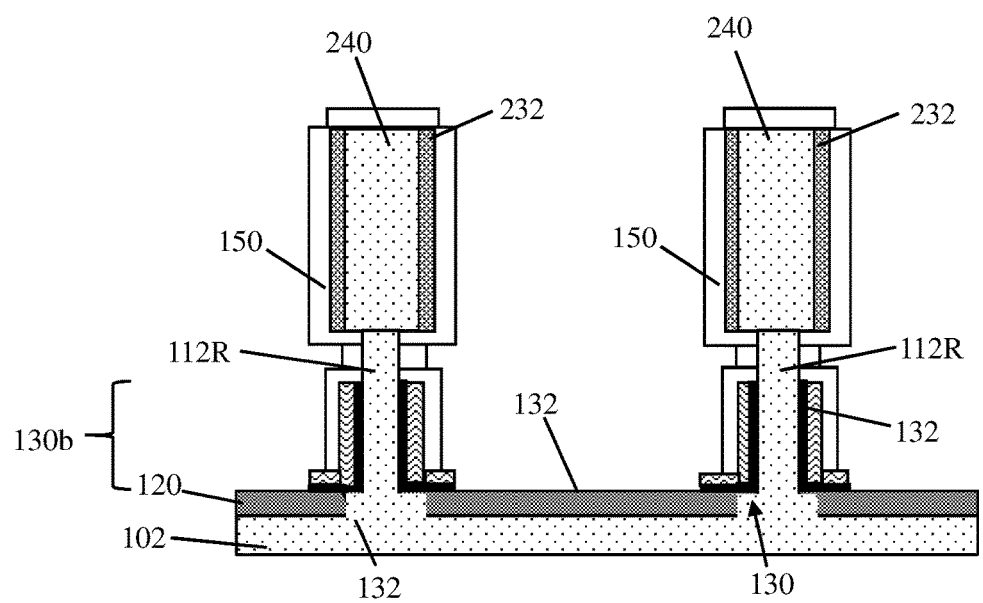
FIG. 28 provides a cross-sectional view of removing the nitride liner and the conformal gate liner adjacent to the semiconductor fins according to further implementations of the disclosure.
Figure 29:
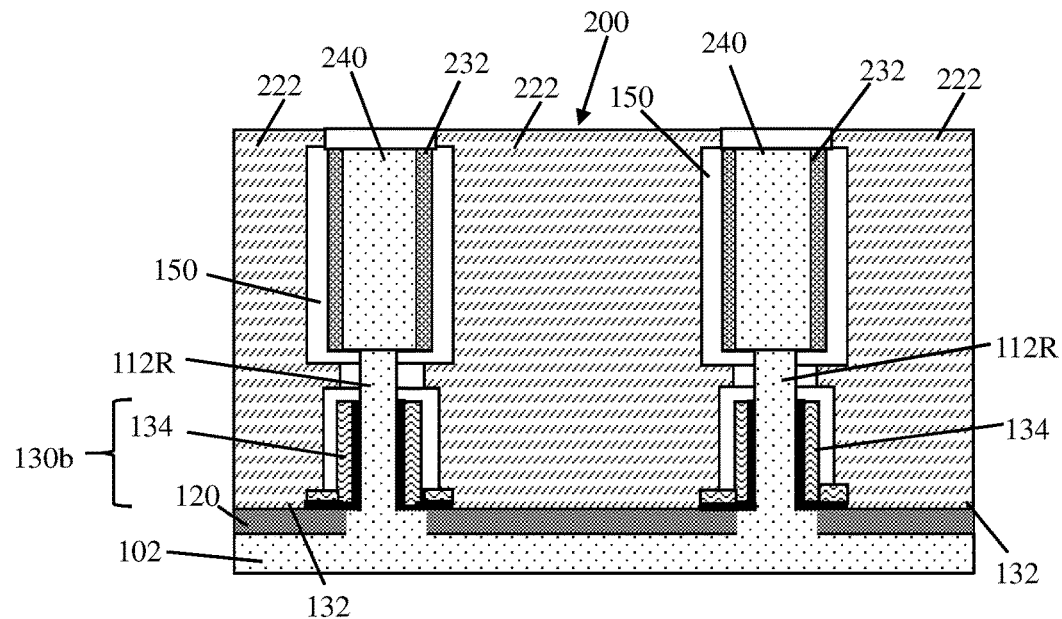
FIG. 29 provides a cross-sectional view of forming an ILD according to further implementations of the disclosure.
Figure 30:
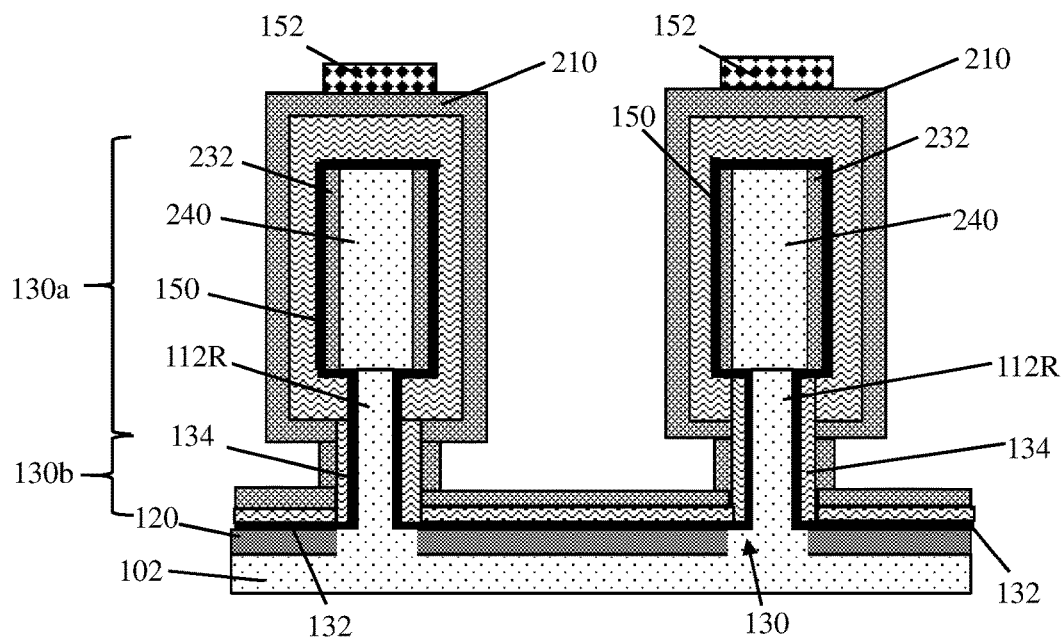
FIG. 30 provides a cross-sectional view of forming an inner spacer and intermediate mask according to further implementations of the disclosure.
Figure 31:
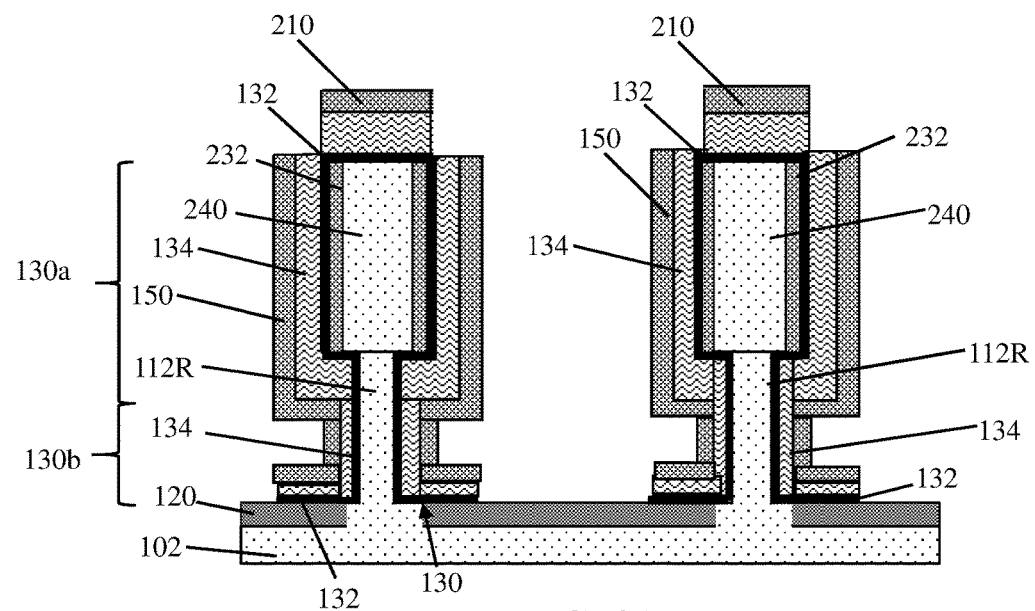
FIG. 31 provides a cross-sectional view of removing the conformal gate liner and inner spacer between the semiconductor fins, according to further implementations of the disclosure.
Figure 32:
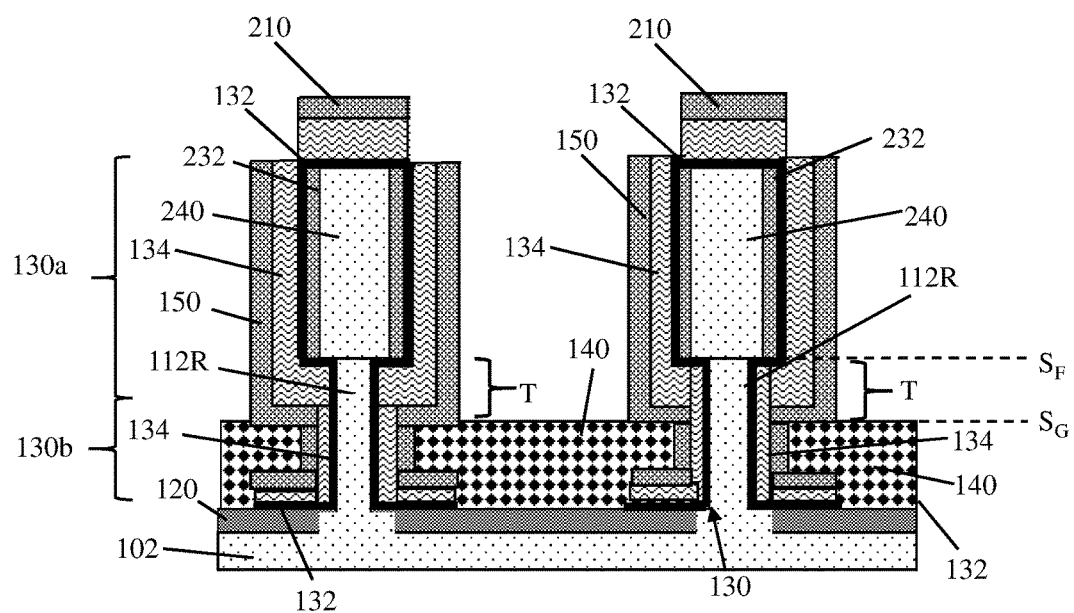
FIG. 32 provides a cross-sectional view of forming a gate mask between semiconductor fins according to further implementations of the disclosure.
Figure 33:
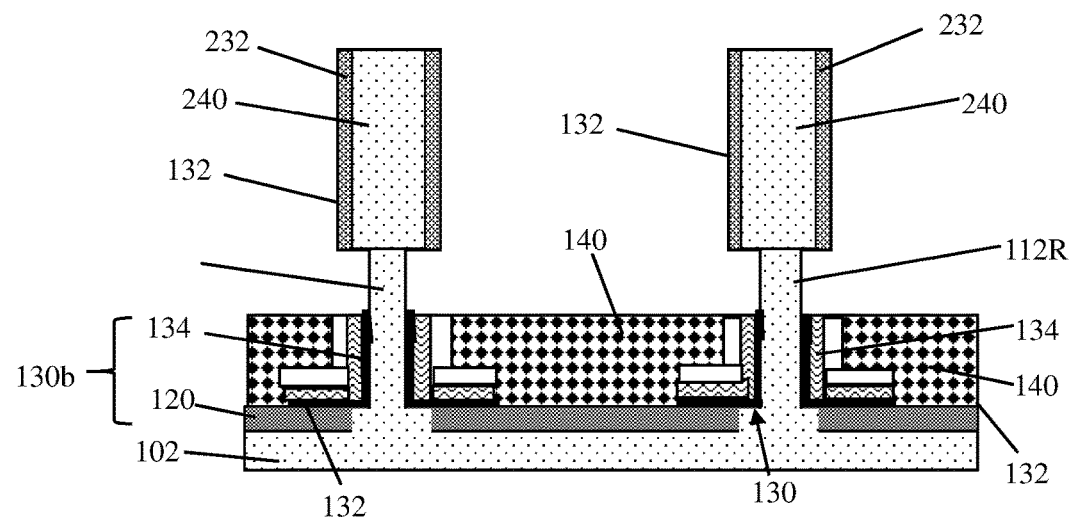
FIG. 33 provides a cross-sectional view of removing the inner spacer and a portion of the conformal gate liner above the gate mask according to further implementations of the disclosure.
Figure 34:
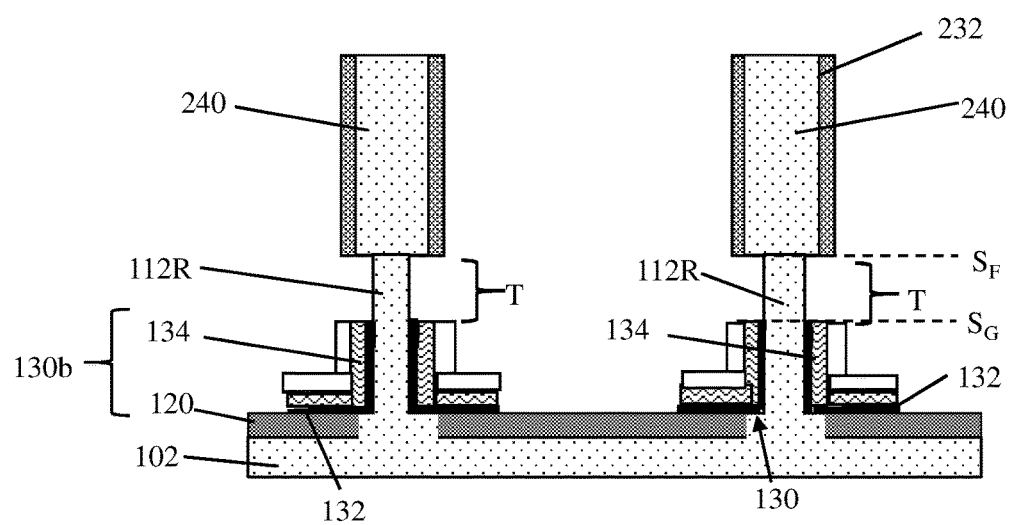
FIG. 34 provides a cross-sectional view of removing the gate mask according to further implementations of the disclosure.
Figure 35:
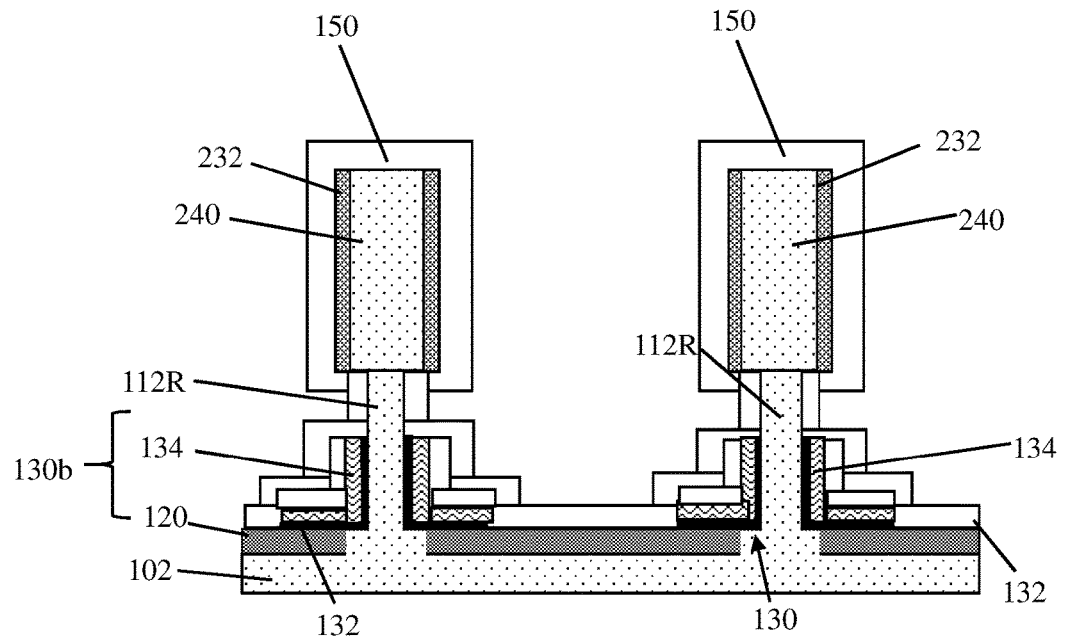
FIG. 35 provides a cross-sectional view of removing the gate dielectric and forming a nitride liner according to further implementations of the disclosure.
Figure 36:
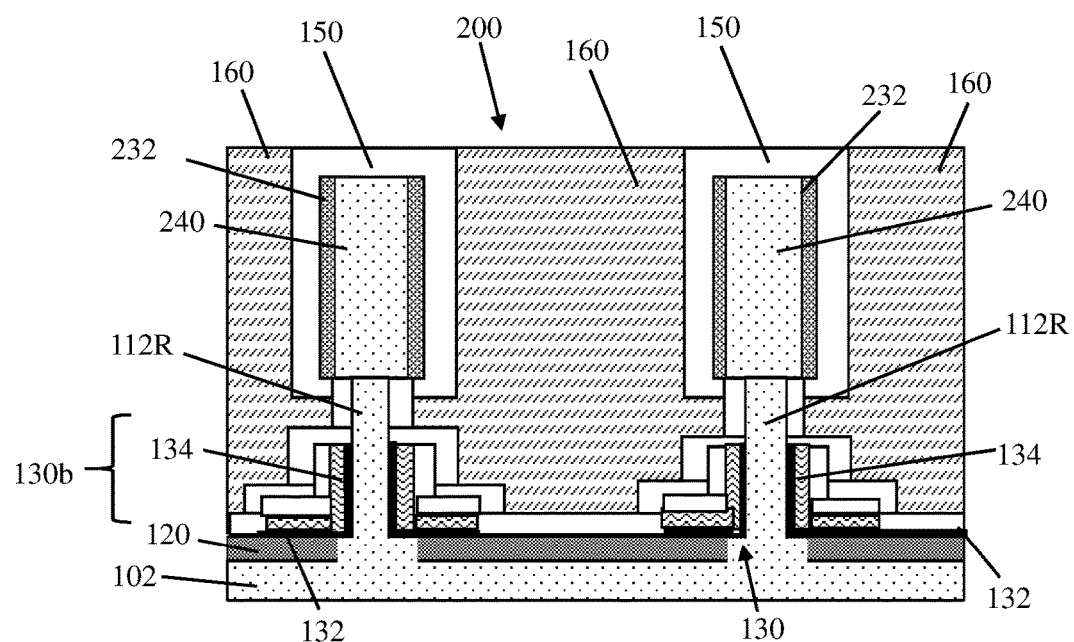
FIG. 36 provides a cross-sectional view of forming an ILD over the separation region according to further implementations of the disclosure.

Referring now to FIG. 22, the disclosure can include selectively removing sacrificial dielectric layer 222 (FIGS. 18-21) to expose recessed fins 112, inner spacer(s) 210, and source/drain regions 240. Sacrificial dielectric layer 222 can be formed, e.g., by way of any currently known or later developed process for selectively removing a dielectric material from an IC structure described herein. In any case, the structure to be processed and illustrated in FIG. 22 may differ from that of FIG. 3 solely by the presence of source/drain spacers 232 and source/drain regions 240 in place of fin mask(s) 114 (FIGS. 1-18). Thus, it will be apparent that the subsequent processing to form and modify conformal gate liner 130 can be implemented in accordance with one or more of the processes described herein with respect to other device structures. Regardless of the selected methodology or combination of methodologies, the disclosure can use the initial thickness of conformal gate liner 130 to define a separation between remaining portions of conformal gate liner 130 and source/drain regions 240.

Referring to FIGS. 23-29 together, the structure with recessed fin(s) 112R, source/drain spacer 232, and source/drain region 240 can be subsequently processed by forming conformal gate liner 130 and using conformal gate liner 130 to define the gate size in a vertical FinFET by applications of the methodology described above. More specifically, FIGS. 23-29 depict this structure being processed in accordance with the same steps described above relative to FIGS. 4-11. For instance, methods according to the disclosure can include forming conformal gate liner 130, e.g., gate dielectric film 132 and conductive gate layer 134, on exposed surfaces of recessed fins 112R, source/drain region(s) 240, and source/drain spacers 232 (shown, e.g., in FIG. 23). The method can then proceed to forming gate mask 140 on second portion 130b conformal gate liner 130 with first portion 130a being exposed (shown, e.g., in FIG. 24). Further processing can include removing first portion 130a of conformal gate liner 130 from at least source/drain region(s) 240 and recessed fin(s) 112R, with the initial thickness T of conformal gate liner 130 separating second portion 130b of conformal gate liner 130 from source/drain region 240 (shown, e.g., in FIG. 25). The method can then proceed to removing gate mask 140 to expose the remainder of conformal gate liner 130 (shown, e.g., in FIG. 26). Additional processing of the structure may include, e.g., forming nitride liner 150 and targeting portions of conformal gate liner 130 adjacent to recessed fins 112R for removal with intermediate masks 152 (shown, e.g., in FIG. 27). Removing such portions of conformal gate liner 130 can expose spacer 120 before intermediate masks 152 are removed (shown, e.g., in FIG. 28). Thereafter, IC structure 200 can be formed, e.g., by forming ILD 160 over substrate 220 and proximate recessed fins 112R, source/drain regions 240 as described herein (shown, e.g., in FIG. 29). With regard to the application of processes described herein to gate-first paradigms (e.g., the structure of FIG. 22), the accompanying description relative to FIGS. 1-11 is fully applicable to the processing techniques shown in FIGS. 23-29.

Referring to FIGS. 22 and 30-36 together, further processing of structures produced via a gate-first paradigm (e.g., the structure of FIG. 22) with recessed fin(s) 112R, source/drain spacer 232, and source/drain region 240, can proceed substantially in accordance with other processing techniques described herein, e.g., relative to FIGS. 4 and 12-16, for processing gate liners positioned adjacent to recessed fins 112R before defining a vertical separation between source/drain region 240 and subsequently formed gates. To this extent, the disclosure can include forming conformal gate liner 130, e.g., gate dielectric film 132 and conductive gate layer 134 on exposed surfaces of recessed fins 112R, spacer 120, source/drain region(s) 240, and source/drain spacers 232 (shown, e.g., in FIG. 30). Further processing may include, e.g., forming inner spacer 210 on conformal gate liner 130 and targeting portions of conformal gate liner 130 and inner spacer 210 adjacent to recessed fins 112R for removal by covering non-targeted regions of inner spacer 210 with intermediate masks 152 (also shown, e.g., in FIG. 30). After removing conformal gate liner 130 and inner spacer 210 outside intermediate masks 152, intermediate masks 152 can be removed (shown, e.g., in FIG. 31). The method can then proceed to forming gate mask 140 on second portion 130b of conformal gate liner 130, with first portion 130a remaining exposed and thus targeted for removal. The thickness T of exposed first portion 130a can define a separation between source/drain region 240 and second portion 130b of conformal gate liner 130 beneath gate mask 140. Further processing can include removing first portion 130a of conformal gate liner 130 from at least source/drain region(s) 240 and recessed fin(s) 112R above gate mask 140 (shown, e.g., in FIG. 33). The initial thickness T of first portion 130a of conformal gate liner 130 thereby defines the resulting vertical separation between source/drain region 240 and the remaining second portion 130b of conformal gate liner 130. The method can then proceed to removing gate mask 140 to expose the remainder of conformal gate liner 130 (shown, e.g., in FIG. 34). Further processing may include, e.g., forming nitride liner 150 on the remaining second portion 130b of conformal gate liner 130 in addition to recessed fins 112R and source/drain region 240 (shown, e.g., in FIG. 35). Thereafter, IC structure 200 can be formed, e.g., by forming ILD 222 over substrate 220 and proximate recessed fins 112R, source/drain regions 240 as described herein (shown, e.g., in FIG. 36). With regard to the application of processes described herein to gate-first paradigms (e.g., the structure of FIG. 22), the accompanying description relative to FIGS. 1-11 is fully applicable to the various processing techniques shown in FIGS. 30-36. Regardless of the applicable processing scheme and/or combination of techniques, further processing can include, e.g., forming contacts to gate and source/drain portions of IC structure 200 to yield an operational transistor device, e.g., one or more vertical FinFET structures or other transistor structures pursuant to any currently known or later developed set of processing techniques.

Referring to FIG. 37, the present disclosure offers a processing methodology to form a vertical FinFET structure 250. The various additional elements shown in FIG. 37 may be formed pursuant to conventional processing techniques, which can remain operable for use on structures 200 without significant modifications thereto. Vertical FinFET structure 250 can include a set of source/drain contacts 262 formed within ILD 160 and directly on source/drain regions of substrate 102 and source/drain regions 240. Source/drain contacts 262 can be formed, e.g., by forming respective cavities within ILD 160 and filling the cavities with source/drain contacts 262. In cases where fin mask 114 (FIGS. 1-18) are not been removed before conformal gate liner 130 is formed and processed, fin mask 114 can be removed (e.g., by etching or other removal process) to form an additional cavity, which can be filled with semiconductive material to create source/drain regions 240. Although source/drain contacts 262 are shown to be within the same cross-section in FIG. 37, it is understood that one or more source/drain contacts 262 can be formed within and/or extend partially into planes in front of or behind the plane of the page. In a similar manner, portions of ILD 160 positioned over at least a portion of conformal gate liner 130 can be removed and filled with a gate contact 264, which may form an electrical connection to one or more regions of conformal gate liner 130. It is also understood that portions of substrate 102, conformal gate liner 130, and/or source/drain contact 240 can have an increased conductivity by forming silicide regions therein, e.g., forming a conductive metal on the semiconductor material and annealing the metal such that it dissolves into the semiconductor material.

Conformal gate liners 130 can thereby serve as gate regions of vertical transistor structure 250 as a result of being processed according to the disclosure. As shown, the initial thickness T of conformal gate liner 130 can continue to define the separation between remaining portions of each conformal gate liner 130 and each source/drain region 240. Furthermore, the various processing techniques described herein can define other portions of vertical FinFET structure 250. For instance, where gate contact 264 is formed over substrate 102 between recessed semiconductor fin 112R and a neighboring recessed semiconductor fin 112R on substrate 102, a lateral separation L between a sidewall of conformal gate liner 130 adjacent to semiconductor fin 112R a sidewall of gate contact 264 the conformal gate liner 130 can be at most approximately 4.5 nanometers (nm). Lateral separation L can thereby electrically insulate portions of the resulting transistor structure from contacts to the same transistor structure, while conserving lateral space on substrate 102.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a vertical FinFET, the method comprising:
   forming a semiconductor fin on a substrate and having a fin mask on an upper surface thereof;
   laterally recessing the semiconductor fin causing the fin mask to overhang above the fin;
   forming a conformal gate liner on the recessed semiconductor fin and the fin mask, wherein the conformal gate liner includes a first portion surrounding the fin mask and a second portion surrounding the recessed fins and being separated from the fin mask by a thickness of the conformal gate liner;
   forming a gate mask laterally adjacent to the second portion of the conformal gate liner;
   removing the first portion of the conformal gate liner, wherein the second portion of the conformal gate liner remains intact after the removing of the first portion;
   removing the gate mask to expose the remaining second portion of the conformal gate liner;
   forming a nitride liner on the remaining second portion of the conformal gate liner, exposed portion of the semiconductor fin above the second portion of the conformal gate liner, and the fin mask, after removing the gate mask to expose the remaining second portion of the conformal gate liner;
   forming an intermediate mask on a portion of the nitride liner that is above the fin mask to vertically cover a vertical section of the first portion of the conformal gate liner adjacent to the recessed semiconductor fin and the nitride liner on top thereof;
   applying a directional etching to remove portions of the conformal gate liner and the nitride liner on top thereof, that are above the substrate and not vertically covered by the intermediate mask;
   removing the intermediate mask; and
   forming a gate contact to the remaining second portion of the conformal gate liner, wherein a length of the gate is determined by the remaining second portion of the conformal gate liner.

2. The method of claim 1, wherein forming the gate mask includes:
   forming an organic planarizing layer (OPL) on the substrate and directly adjacent to the first and second portions of the conformal gate liner, the OPL having a first region underneath a lateral section of the first portion of the conformal gate liner and a second region lateral to a vertical section of the first portion of the conformal gate liner; and
   etching the OPL until a height of the second region of the OPL becomes equal to or lower than a height of the first region of the OPL.

3. The method of claim 1, wherein the conformal gate liner comprises a gate dielectric film covered by a conductive gate layer, and wherein removing the first portion of the conformal gate liner comprises:
   removing the conductive gate layer to expose the gate dielectric film; and
   removing the exposed gate dielectric film.

4. The method of claim 1, further comprising forming an inter-level dielectric (ILD) laterally adjacent to the semiconductor fin after removing the gate mask.

5. The method of claim 1, wherein forming the conformal gate liner includes:
   forming a gate dielectric film on exposed surfaces of the semiconductor fin and the fin mask; and
   comformally depositing a conductive gate layer on exposed surfaces of the gate dielectric film.

6. The method of claim 1, wherein the gate contact is formed over the substrate between the recessed semiconductor fin and a neighboring semiconductor fin positioned over the substrate, and wherein a lateral separation between a sidewall of the conformal gate liner adjacent to the semiconductor fin and a sidewall of the gate contact is at most approximately 4.5 nanometers (nm).

7. A method of forming a vertical FinFET, the method comprising:
   forming a semiconductor fin on a substrate and having a fin mask on an upper surface thereof;
   laterally recessing the semiconductor fin causing the fin mask to overhang above the fin;
   forming a conformal gate liner on the recessed semiconductor fin and the fin mask, wherein the conformal gate liner includes a first portion surrounding the fin mask and a second portion surrounding the recessed fins and being separated from the fin mask by a thickness of the conformal gate liner;
   forming a gate mask laterally adjacent to the second portion of the conformal gate liner;
   removing the first portion of the conformal gate liner, wherein the second portion of the conformal gate liner remains intact after the removing of the first portion;
   removing the gate mask to expose the remaining second portion of the conformal gate liner;
   forming a nitride liner on at least the remaining second portion of the conformal gate liner;
   selectively removing portions of the conformal gate liner above the substrate, and the nitride liner on top thereof; and
   forming a gate contact to the remaining second portion of the conformal gate liner, wherein a length of the gate is determined by the remaining second portion of the conformal gate liner.

8. The method of claim 7, wherein forming the gate mask includes:
   forming an organic planarizing layer (OPL) on the substrate and directly adjacent to the first and second portions of the conformal gate liner, the OPL having a first region underneath a lateral section of the first portion of the conformal gate liner and a second region lateral to a vertical section of the first portion of the conformal gate liner; and
   etching the OPL until a height of the second region of the OPL becomes equal to or lower than a height of the first region of the OPL.

9. The method of claim 7, wherein the conformal gate liner comprises a gate dielectric film covered by a conductive gate layer, and wherein removing the first portion of the conformal gate liner comprises:
   removing the conductive gate layer to expose the gate dielectric film; and
   removing the exposed gate dielectric film.

10. The method of claim 7, further comprising forming an inter-level dielectric (ILD) laterally adjacent to the semiconductor fin after removing the gate mask.

11. The method of claim 7, wherein forming the conformal gate liner includes:
    forming a gate dielectric film on exposed surfaces of the semiconductor fin and the fin mask; and
    comformally depositing a conductive gate layer on exposed surfaces of the gate dielectric film.

12. The method of claim 7, wherein the gate contact is formed over the substrate between the recessed semiconductor fin and a neighboring semiconductor fin positioned over the substrate, and wherein a lateral separation between a sidewall of the conformal gate liner adjacent to the semiconductor fin and a sidewall of the gate contact is at most approximately 4.5 nanometers (nm).

13. A method of forming a vertical FinFET, the method comprising:
    providing a structure including:
       a semiconductor fin on a substrate,
       a fin mask on an upper surface of the substrate, wherein horizontal sidewalls of the fin mask overhang sidewalls of the semiconductor fin,
       a conformal gate liner conformally coating exposed surfaces of the semiconductor fin and the fin mask, wherein the conformal gate liner includes a first portion surrounding the fin mask and a second portion surrounding the recessed fins and being separated from the fin mask by a thickness of the conformal gate liner, and
       a gate mask laterally adjacent to the second portion of the conformal gate liner;
    removing the first portion of the conformal gate liner, wherein the second portion of the conformal gate liner remains intact after the removing of the first portion;
    removing the gate mask to expose the remaining second portion of the conformal gate liner;
    forming a nitride liner on the remaining second portion of the conformal gate liner, exposed portion of the semiconductor fin above the second portion of the conformal gate liner, and the fin mask, after removing the gate mask to expose the remaining second portion of the conformal gate liner;
    forming an intermediate mask on a portion of the nitride liner that is above the fin mask to vertically cover a vertical section of the first portion of the conformal gate liner adjacent to the recessed semiconductor fin and the nitride liner on top thereof;
    applying a directional etching to remove portions of the conformal gate liner and the nitride liner on top thereof, that are above the substrate and not vertically covered by the intermediate mask;

removing the intermediate mask; and forming a gate contact to the remaining second portion of the conformal gate liner, wherein a length of the gate is determined by the remaining second portion of the conformal gate liner.

14. The method of claim 13, wherein the conformal gate liner comprises a gate dielectric film covered by a conductive gate layer, and wherein removing the first portion of the conformal gate liner comprises:

removing the conductive gate layer to expose the gate dielectric film; and removing the exposed gate dielectric film.

15. The method of claim 13, further comprising forming an inter-level dielectric (ILD) laterally adjacent to the semiconductor fin after removing the gate mask.

16. The method of claim 13, The method of claim 7, wherein the gate contact is formed over the substrate between the recessed semiconductor fin and a neighboring semiconductor fin positioned over the substrate, and wherein a lateral separation between a sidewall of the conformal gate liner adjacent to the semiconductor fin and a sidewall of the gate contact is at most approximately 4.5 nanometers (nm).

* * * * *